United States Patent [19]
Chaddha

[11] Patent Number: 6,154,572
[45] Date of Patent: *Nov. 28, 2000

[54] TABLE BASED COMPRESSION WITH EMBEDDED CODING

[75] Inventor: Navin Chaddha, Stanford, Calif.

[73] Assignee: Microsoft, Inc., Redmond, Wash.

[ * ] Notice: This patent issued on a continued prosecution application filed under 37 CFR 1.53(d), and is subject to the twenty year patent term provisions of 35 U.S.C. 154(a)(2).

[21] Appl. No.: 08/885,159

[22] Filed: Jun. 30, 1997

Related U.S. Application Data

[62] Division of application No. 08/623,299, Mar. 28, 1996.

[51] Int. Cl.[7] ............................. G06K 9/36; G06K 9/38; G06K 9/46

[52] U.S. Cl. ........................................... 382/253; 382/248

[58] Field of Search ..................................... 382/253, 248, 382/250, 233, 238, 240; 348/414, 417, 418, 422

[56] References Cited

U.S. PATENT DOCUMENTS

| | | | |
|---|---|---|---|
| 4,987,480 | 1/1991 | Lippman et al. | 358/13 |
| 5,060,285 | 10/1991 | Dixit et al. | 382/253 |
| 5,282,255 | 1/1994 | Bovik et al. | 382/56 |
| 5,341,441 | 8/1994 | Maeda et al. | 382/56 |
| 5,371,544 | 12/1994 | Jacquin et la. | 348/398 |
| 5,521,988 | 5/1996 | Li et al. | 382/248 |
| 5,592,228 | 1/1997 | Dachiku et al. | 348/416 |
| 5,602,589 | 2/1997 | Wishwanath et al. | 382/248 |
| 5,623,312 | 4/1997 | Yan et al. | 348/416 |

OTHER PUBLICATIONS

Chou et al, "Optimal Pruning with Applications to Tree–Structured Source Coding and Modeling," IEEE Trans. Inform. Theory, vol. 35, No. 2, pp. 299–315, Mar. 1989.

Nasrabadi et al, "Image Coding Using Vector Quantization: A Review," Reprinted from IEEE Trans. Commun., vol. COM–36, pp. 957–971, Aug. 1988.

Linde, Y., et al., "An Algorithm for Vector Quantization Design", *IEEE Transactions on Communications*, vol. COM–28, No. 1, 84–95, (Jan. 1980).

Chaddha, N., et al., "Constrained and Recursive Hierarchical Table–Lookup Vector Quantization", Data Compression, 1996 Conference, pp. 220–229, (1996).

Chaddha, N., et al., "Hierarchical Vector Quantization of Perceptually Weighted Block Transforms", *IEEE*, pp. 3–12, (1995).

(List continued on next page.)

*Primary Examiner*—Phuoc Tran
*Attorney, Agent, or Firm*—Schwegman, Lundberg, Woessner & Kluth, P.A.

[57] ABSTRACT

An image compression system includes a vectorizer and a hierarchical vector quantization table that outputs embedded code. The vectorizer converts an image into image vectors representing respective blocks of image pixels. The table provides computation-free transformation and compression of the image vectors. Table design can be divided into codebook design and fill-in procedures for each stage. Codebook design for the preliminary stages uses a splitting generalized Lloyd algorithm (LBG/GLA) using a perceptually weighted distortion measure. Codebook design for the final stage uses a greedily-grown and then entropy-pruned tree-structure variation of GLA with an entropy-constrained distortion measure. Table fill-in for all stages uses an unweighted proximity measure for assigning inputs to codebook vectors. Transformations and compression are fast because they are computation free. The hierarchical, multistage, character of the table allow it to operate with low memory requirements. The embedded output allows convenient scalability suitable for collaborative video applications over heterogeneous networks.

14 Claims, 9 Drawing Sheets

OTHER PUBLICATIONS

Cosman, P.C., et al., "Using Vector Quantization for Image Processing", *Proceedings of the IEEE*, vol. 81, No. 9, 1326–1341, (1993).

Ho, Y., et al., "Variable–rate Multi–stage Vector Quantization for Image Coding", *IEEE*, pp. 1156–1159, (1988).

Mehrotra, S., et al., "Predictive Hierarchical Table–Lookup Vector Quantization with Quadtree Encoding", Proceedings. International Conference on Image Processing, (Cat. No. 96CH35919), vol. 3, pp. 407–410, (1996).

Vishwanath, M., "Algorithms and archtiectures for hierarchical compression of video", Proceedings of International Conference on Applicaiton Specific Array Processors, 10–21, (1994).

Yang, K., et al., "Motion compensated wavelet transform coder for very low bit–rate visual telephony", *Signal Processing: Image Communication*, vol. 7, pp. 581–592, (1995).

TABLE BASED COMPRESSION WITH EMBEDDED CODING

This is a divisional application of U.S. patent application Ser. No. 08/623,299 filed Mar. 8, 1996.

BACKGROUND OF THE INVENTION

The present invention relates to data processing and, more particularly, to data compression, for example as applied to still and video images, speech and music. A major objective of the present invention is to enhance collaborative video applications over heterogeneous networks of inexpensive general purpose computers.

As computers are becoming vehicles of human interaction, the demand is rising for the interaction to be more immediate and complete. Where text-based e-mail and database services predominated on local networks and on the Internet, the effort is on to provide such data intensive services such as collaborative video applications, e.g., video conferencing and interactive video.

In most cases, the raw data requirements for such applications far exceed available bandwidth, so data compression is necessary to meet the demand. Effectiveness is a goal of any image compression scheme. Speed is a requirement imposed by collaborative applications to provide an immediacy to interaction. Scalability is a requirement imposed by the heterogeneity of networks and computers.

Effectiveness can be measured in terms of the amount of distortion resulting for a given degree of compression. The distortion can be expressed in terms of the square of the difference between corresponding pixels averaged over the image, i.e., mean square error (less is better). The mean square error can be: 1) weighted, for example, to take variations in perceptual sensitivity into account; or 2) unweighted.

The extent of compression can be measured either as a compression ratio or a bit rate. The compression ratio (more is better) is the number of bits of an input value divided by the number of bits in the expression of that value in the compressed code (averaged over a large number of input values if the code is variable length). The bit rate is the number of bits of compressed code required to represent an input value. Compression effectiveness can be characterized by a plot of distortion as a function of bit rate.

Ideally, there would be zero distortion, and there are lossless compression techniques that achieve this. However, lossless compression techniques tend to be limited to compression ratios of about 2, whereas compression ratios of 20 to 500 are desired for collaborative video applications. Lossy compression techniques always result in some distortion. However, the distortion can be acceptable, even imperceptible, while much greater compression is achieved.

Collaborative video is desired for communication between general purpose computers over heterogeneous networks, including analog phone lines, digital phone lines, and local-area networks. Encoding and decoding are often computationally intensive and thus can introduce latencies or bottlenecks in the data stream. Often dedicated hardware is required to accelerate encoding and decoding. However, requiring dedicated hardware greatly reduces the market for collaborative video applications. For collaborative video, fast, software-based compression would be highly desirable.

Heterogeneous networks of general purpose computers present a wide range of channel capacities and decoding capabilities. One approach would be to compress image data more than once and to different degrees for the different channels and computers. However, this is burdensome on the encoding end and provides no flexibility for different computing power on the receiving end. A better solution is to compress image data into a low-compression/low distortion code that is readily scalable to greater compression at the expense of greater distortion.

State-of-the-art compression schemes have been promulgated as standards by an international Motion Picture Experts Group; the current standards are MPEG-1 and MPEG-2. These standards are well suited for applications involving playback of video encoded off-line. For example, they are well suited to playback of CD-ROM and DVD disks. However, compression effectiveness is non-optimal, encoding requirements are excessive, and scalability is too limited. These limitations can be better understood with the following explanation.

Most compression schemes operate on digital images that are expressed as a two-dimensional array of picture elements (pixels) each with one (as in a monochrome or gray-scale image) or more (as in a color image) values assigned to each pixel. Commonly, a color image is treated as a superposition of three independent monochrome images for purposes of compression.

The lossy compression techniques practically required for video compression generally involve quantization applied to monochrome (gray-scale or color component) images. In quantization, a high-precision image description is converted to a low-precision image description, typically through a many-to-one mapping. Quantization techniques can be divided into scalar quantization (SQ) techniques and vector quantization (VQ) techniques. While scalars can be considered one-dimensional vectors, there are important qualitative distinctions between the two quantization techniques.

Vector quantization can be used to process an image in blocks, which are represented as vectors in an n-dimensional space. In most monochrome photographic images, adjacent pixels are likely to be close in intensity. Vector quantization can take advantage of this fact by assigning more representative vectors to regions of the n-dimensional space in which adjacent pixels are close in intensity than to regions of the n-dimensional space in which adjacent pixels are very different in intensity. In a comparable scalar quantization scheme, each pixel would be compressed independently; no advantage is taken of the correlations between adjacent pixels. While, scalar quantization techniques can be modified at the expense of additional computations to take advantage of correlations, comparable modifications can be applied to vector quantization. Overall, vector quantization provides for more effective compression than does scalar quantization.

Another difference between vector and scalar quantization is how the representative values or vectors are represented in the compressed data. In scalar quantization, the compressed data can include reduced precision expressions of the representative values. Such a representation can be readily scaled simply by removing one or more least-significant bits from the representative value. In more sophisticated scalar quantization techniques, the representative values are represented by indices; however, scaling can still take advantage of the fact that the representative values have a given order in a metric dimension. In vector quantization, representative vectors are distributed in an n-dimensional space. Where n>1, there is no natural order to the representative vectors. Accordingly, they are assigned effectively arbitrary indices. There is no simple and effective way to manipulate these indices to make the compression scalable.

The final distinction between vector and scalar quantization is more quantitative than qualitative. The computations required for quantization scale dramatically (more than linearly) with the number of pixels involved in a computation. In scalar quantization, one pixel is processed at a time. In vector quantization, plural pixels are processed at once. In the case of popular 4×4 and 8×8 block sizes, the number of pixels processed at once becomes 16 and 64, respectively. To achieve minimal distortion, "full-search" vector quantization computes the distances in an n-dimensional space of an image vector from each representative vector Accordingly, vector quantization tends to be much slower than scalar quantization and, therefore, limited to off-line compression applications.

Because of its greater effectiveness, considerable effort has been directed to accelerating vector quantization by eliminating some of the computations required. There are structured alternatives to "full-search" VQ that reduce the number of computations required per input block at the expense of a small increase in distortion. Structured VQ techniques perform comparisons in an ordered manner so as to exclude apparently unnecessary comparisons. All such techniques involve some risk that the closest comparison will not be found. However, the risk is not large and the consequence typically is that a second closest point is selected when the first closest point is not. While the net distortion is larger than with full search VQ, it is typically better than scalar VQ performed on each dimension separately.

In "tree-structured" VQ, comparisons are performed in pairs. For example, the first two measurements can involve codebook points in symmetrical positions in the upper and the lower halves of a vector space. If an image input vector is closer to the upper codebook point, no further comparisons with codebook points in the lower half of the space are performed. Tree-structured VQ works best when the codebook has certain symmetries. However, requiring these symmetries reduces the flexibility of codebook design so that the resulting codebook is not optimal for minimizing distortion. Furthermore, while reduced, the computations required by tree-structured VQ can be excessive for collaborative video applications.

In table-based vector quantization (TBVQ), the assignment of all possible blocks to codebook vectors is pre-computed and represented in a lookup table. No computations are required during image compression. However, in the case of 4×4 blocks of pixels, with eight-bits allotted to characterize each pixel, the number of table addresses would be $256^{16}$, which is clearly impractical. Hierarchical table-based vector quantization (HTBVQ) separates a vector quantization table into stages; this effectively reduces the memory requirements, but at a cost of additional distortion.

Further, it is well known that the pixel space in which images are originally expressed is often not the best for vector quantization. Vector quantization is most effective when the dimensions differ in perceptual significance. However, in pixel space, the perceptual significance of the dimensions (which merely represent different pixel positions in a block) does not vary. Accordingly, vector quantization is typically preceded by a transform such as a wavelet transform. Thus, the value of eliminating computations during vector quantization is impaired if computations are required for transformation prior to quantization. While some work has been done integrating a wavelet transform into a HTBVQ table, the resulting effectiveness has not been satisfactory.

It is recognized that hardware accelerators can be used to improve the encoding rate of data compression systems. However, this solution is expensive. More importantly, it is awkward from a distribution standpoint. On the Internet, images and Web Pages are presented in many different formats, each requiring their own viewer or "browser". To reach the largest possible audience without relying on a lowest common denominator viewing technology, image providers can download viewing applications to prospective consumers. Obviously, this download distribution system would not be applicable for hardware based encoders. If encoders for collaborative video are to be downloadable, they must be fast enough for real-time operation in software implementations. Where the applications involve collaborative video over heterogeneous networks of general purpose computers, there is still a need for a downloadable compression scheme that provides a more optimal combination of effectiveness, speed, and scalability.

SUMMARY OF THE INVENTION

The present invention provides for data compression using a hierarchical table implementing a block transform and outputting a variable-rate, embedded code. There are several aspects of the invention that are brought together to achieve optimal benefits, but which can be used separately.

A counterintuitive aspect of the present invention is the incorporation of a codebook of a type used for structured vector quantization in a compression table. Structured vector quantization is designed to reduce the computations required for compression while accepting a small increase in distortion relative to full-search vector quantization. However, this tradeoff is a poor one in the context of tables, since all the computations are pre-computed.

In the present case, a codebook design procedure used for tree-structured vector quantization is used, not to reduce computations, but to provide a codebook that can be mapped readily to an embedded code. In an embedded code, bits are arranged in order of significance. When the least significant bit of a multi-bit index to a first codebook vector is dropped, the result is an index of a codebook vector near the first codebook vector. Thus, an embedded code is readily scaled to provide a variable-rate system.

An embedded code can readily be made variable length to minimize entropy and reduce the bit rate for a net gain in compression effectiveness. Thus, any loss of effectiveness resulting from the use of a structured vector quantization codebook is at least partially offset by the gain in compression effectiveness resulting from the use of a variable-length code.

Another aspect of the invention is the implementation of block transforms in the table. Block transforms can express data so that information can be separated by significance. This makes it feasible to apply more compression to less significant data for a net gain in the apparent effectiveness of the compression.

In the case of image or other sensory data compression, if the space to which the data is transformed is not perceptually linear, a perceptually weighted proximity measure can be used during codebook design. In accordance with the present invention, an unweighted or less perceptually weighted proximity measure should be used during a table fill-in procedure to minimize distortion.

A further aspect of the invention is the incorporation of considerations other than perceptually weighted or unweighted proximity measures in codebook design. For example, entropy constraints can be imposed on codebook design to enhance bit rate. In the (greedy) growing of a decision tree, a joint entropy and distortion measure can be used to select nodes to be grown or pruned. If the joint measure is applied on a node-by-node basis, virtually continuous scalability can be provided while maintaining high compression effectiveness at each available bit rate.

A final aspect of the invention takes advantage of the lower memory requirements afforded by hierarchical tables. Hierarchical tables raise the issue of how to incorporate structures, constraints, and transforms in a table. In the case of the block transforms, the transforms are used in codebook design at every stage of the table. However, in the case of structures and constraints used to provide variable-length codes, these are best restricted to design of the last-stage table only.

It is not necessary for all aspects of the invention to be practiced together to attain advantages. However, when combined to yield a table-based data compression system with a variable-rate embedded code, the result is optimally suited for collaborative video applications. Scalability at both the encoding and decoding ends is provided by the embedded code. Speed is provided by the use of tables in which everything is pre-computed; by using the hierarchical tables, memory requirements can be made reasonable. Compression effectiveness is enhanced by incorporated block transforms and entropy considerations into codebook design. Thus, the compression is suitable for software only applications; thus, the compression scheme can be distributed over networks to make collaborative video applications widely available. These and other features and advantages of the invention are apparent from the description below with reference to the following drawing.

DESCRIPTION OF THE PREFERRED EMBODIMENTS

Figure 1:
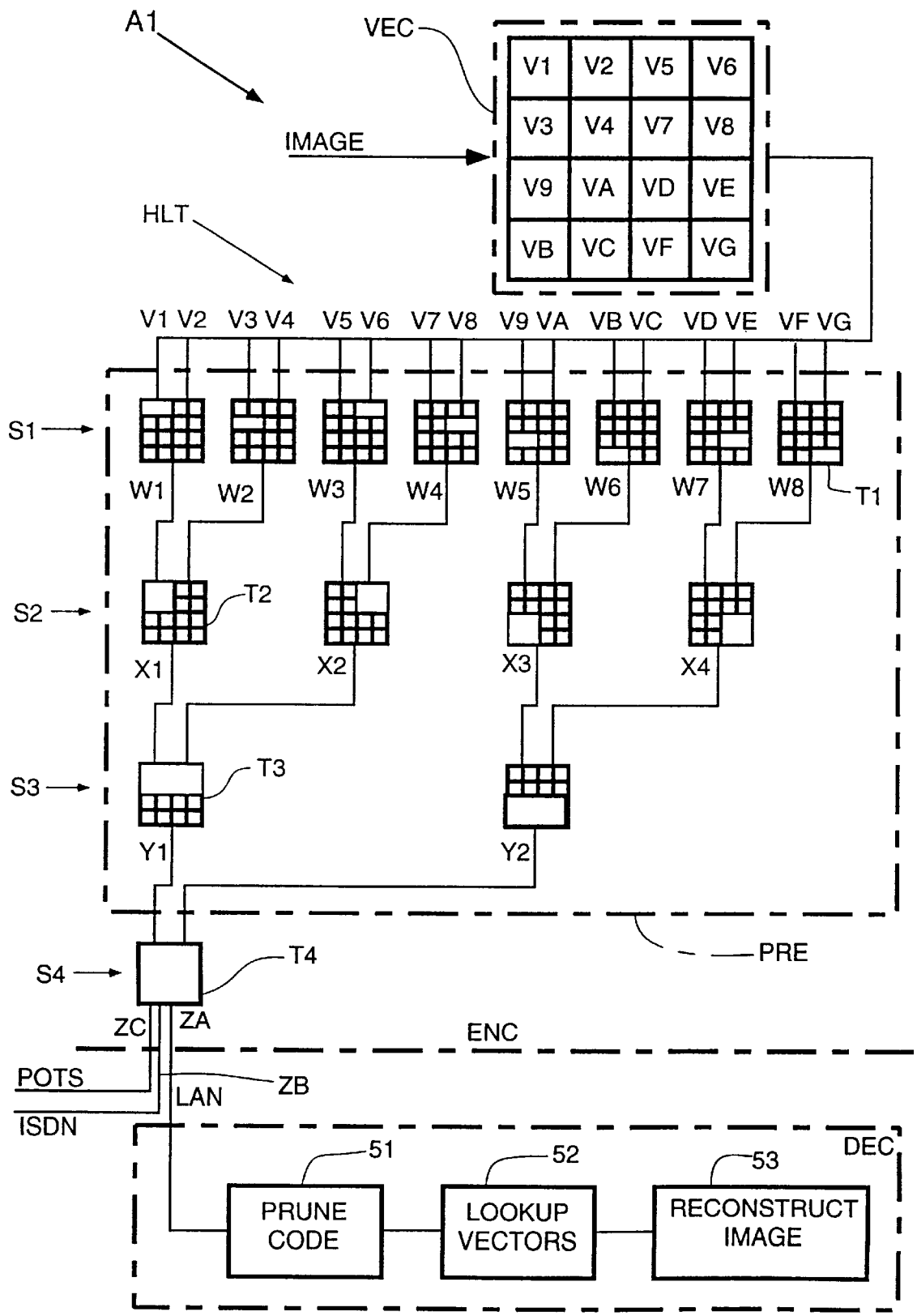
FIG. 1 is a schematic illustration of an image compression system in accordance with the invention.

In accordance with the present invention, an image compression system A1 comprises an encoder ENC, communications lines LAN, POTS, and ISDN, and a decoder DEC, as shown in FIG. 1. Encoder ENC is designed to compress an original image for distribution over the communications lines.

Communications lines POTS, ISDN, and LAN differ widely in bandwidth. "Plain Old Telephone Service" line POTS, which includes an associated modem, conveys data at a nominal rate of 28.8 kbps (kilobits per second). "Integrated Services Digital Network" line ISDN conveys data an order of magnitude faster. "Local Area Network" line LAN conveys data at about 10 megabits per second. Many receiving and decoding computers are connected to each line, but only one computer is represented in FIG. 1 by decoder DEC. These computers decompress the transmission from encoder ENC and generate a reconstructed image that is faithful to the original image.

Encoder ENC comprises a vectorizer VEC and a hierarchical lookup table HLT, as shown in FIG. 1. Vectorizer VEC converts a digital image into a series of image vectors Ii. Hierarchical lookup table HLT converts the series of vectors Ii into three series of indices ZAi, ZBi, and ZCi. Index ZAi is a high-average-precision variable-length embedded code for transmission along line LAN, index ZBi is a moderate-average-precision variable-length embedded code for transmission along line ISDN, and index ZCi is a low-average-precision variable-length embedded code for transmission along line POTS. The varying precision accommodates the varying bandwidths of the lines.

Vectorizer VEC effectively divides an image into blocks Bi of 4×4 pixels, where i is a block index varying from 1 to the total number of blocks in the image. If the original image is not evenly divisible by the chosen block size, additional pixels can be added to sides of the image to make the division even in a manner known in the art of image analysis. Each block is represented as a 16-dimensional vector Ii=(Vij) where j is a dimension index ranging from one to sixteen (1-G, septadecimal notation) in the order shown in FIG. 1 of the pixels in block Bi. Since only one block is illustrated in FIG. 1, the "i" index is omitted from the vector values in FIG. 1 and below.

Each vector element Vj is expressed in a suitable precision, e.g., eight bits, representing a monochromatic (color or gray scale) intensity associated with the respective pixel. Vectorizer VEC presents vector elements Vj to hierarchical lookup table HLT in adjacently numbered odd-even pairs (e.g., V1, V2) as shown in FIG. 1.

Hierarchical lookup table HLT includes four stages S1, S2, S3, and S4. Stages S1, S2, and S3 collectively constitute a preliminary section PRE of hierarchical lookup table HLT, while fourth stage S4 constitutes a final section. Each stage S1, S2, S3, S4, includes a respective stage table T1, T2, T3, T4. In FIG. 1, the tables of the preliminary section stages S1, S2, and S3 are shown multiple times to represent the number of times they are used per image vector. For example, table T1 receives eight pairs of image vector elements Vj and outputs eight respective first-stage indices Wj. If the processing power is affordable, a stage can include several tables of the same design so that the pairs of input values can be processed in parallel.

The purpose of hierarchical lookup table is to map each image vector many-to-one to each of the embedded indices ZA, ZB, and ZC. Note that the total number of distinct image vectors is the number of distinct values a vector value Vj can assume, in this case $2^8$=256, raised to the number of dimensions, in this case sixteen. It is impractical to implement a table with $256^{16}$ entries. The purpose of preliminary section PRE is to reduce the number of possible vectors that must be compressed with minimal loss of perceptually relevant information. The purpose of final-stage table T4 is to map the reduced number of vectors many-to-one to each set of embedded indices. Table T4 has $2^{20}$ entries corresponding to the concatenation of two ten-bit inputs. Tables T2, and T3 are the same size as table T4, while table T1 is smaller with $2^{16}$ entries. Thus, the total number of addresses for all stages of hierarchical vector table HLT is less than four million, which is a practical number of table entries. For computers where that is excessive, all tables can be limited to $2^{16}$ entries, as described below so that the total number of table entries is about one million.

Each preliminary stage table T1, T2, T3, has two inputs and one output, while final stage T4 has two inputs and three outputs. Pairs of image vector elements Vj serve as inputs to first stage table T1. The vector elements can represent values associated with respective pixels of an image block. However, the invention applies as well if the vector elements Vj represent an array of values obtained after a transformation on an image block. For example, the vector elements can be coefficients of a discrete cosine transform applied to an image block.

On the other hand, it is computationally more efficient to embody a pre-computed transform in the hierarchical lookup table than to compute the transform for each block of each image being classified. Accordingly, in the present case, each input vector is in the pixel domain and hierarchical table HLT implements a discrete cosine transform. In other words, each vector value Vj is treated as representing a monochrome intensity value for a respective pixel of the associated image block, while indices Wj, Xj, Yj, ZA, ZB, and ZC, represent vectors in the spatial frequency domain.

Each pair of vector values (Vj, V(j+1)) represents with a total of sixteen bits a 2×1 (column×row) block of pixels. For example, (V1,V2) represents the 2×1 block highlighted in the leftmost replica of table T1 in FIG. 1. Table T1 maps pairs of vector element values many-to-one to eight-bit first-stage indices Wj; in this case, j ranges from 1 to 8. Each eight-bit Wj also represents a 2×1-pixel block. However, the precision is reduced from sixteen bits to eight bits. For each image vector, there are sixteen vector values Vj and eight first-stage indices Wj.

The eight first-stage indices Wj are combined into four adjacent odd-even second-stage input pairs; each pair (Wj, W(j+1)) represents in sixteen-bit precision the 2×2 block constituted by the two 2×1 blocks represented by the individual first-stage indices Wj. For example, (W1,W2) represents the 2×2 block highlighted in the leftmost replica of table T2 in FIG. 1. Second stage table T2 maps each second-stage input pair of first-stage indices many-to-one to a second stage index Xj. For each image input vector, the eight first-stage indices yield four second-stage indices X1, X2, X3, and X4. Each of the second stage indices Xj represents a 2×2 image block with eight-bit precision.

The four second-stage indices Xj are combined into two third-stage input pairs (X1, X,2) and (X3, X4), each representing a 4×2 image block with sixteen-bit precision. For example, (X1, X2) presents the upper half block highlighted in the left replica of table T3, while (X3, X4) represents the lower half block highlighted in the right replica of table T3 in FIG. 1. Third stage table T3 maps each third-stage input pair many-to-one to eight-bit third-stage indices Y1 and Y2. These two indices Y1 and Y2 are the output of preliminary section PRE in response to a single image vector.

The two third-stage indices are paired to form a fourth-stage input pair (Y1, Y2) that expresses an entire image block with sixteen-bit precision. Fourth-stage table T4 maps fourth-stage input pairs many-to-one to each of the embedded indices ZA, ZB, and ZC. For an entire image, there are many image vectors Ii, each yielding three respective output indices ZAi, ZBi, and ZCi. The specific relationship between inputs and outputs is shown in Table I below as well as in FIG. 1.

TABLE I

Lookup Table Mapping

| Lookup Table | Inputs | Output |
|---|---|---|
| T1 | V1, V2 | W1 |
| " | V3, V4 | W2 |
| " | V5, V6 | W3 |
| " | V7, V8 | W4 |
| " | V9, VA | W5 |
| " | VB, VC | W6 |
| " | VD, VE | W7 |
| " | VF, VG | W8 |
| T2 | W1, W2 | X1 |
| " | W3, W4 | X2 |
| " | W5, W6 | X3 |
| " | W7, W8 | X4 |
| T3 | X1, X2 | Y1 |
| " | X3, X4 | Y2 |
| T4 | Y1, Y2 | ZA, ZB, ZC |

Decoder DEC is designed for decompressing an image received from encoder ENC over a LAN line. Decoder DEC includes a code pruner 51, a decode table 52, and an image assembler 53. Code pruner 51 performs on the receiving end the function that the multiple outputs from stage S4 perform on the transmitting end: allowing a tradeoff between fidelity and bit rate. Code pruner 51 embodies the criteria for pruning index ZA to obtain indices ZB and ZC; alternatively, code pruner 51 can pass index ZA unpruned. As explained further below, the code pruning effectively reverts to an earlier version of the greedily grown tree. In general, the pruned codes generated by a code pruner need not match those generated by the encoder. For example, the code pruner could provide a larger set of alternatives.

If a fixed length compression code is used instead of a variable-length code, the pruning function can merely involve dropping a fixed number of least-significant bits from the code. This truncation can take place at the encoder at the hierarchical table output and/or at the decoder. A more sophisticated approach is to prune selectively based on an entropy constraint.

Decode table 52 is a lookup table that converts codes to reconstruction vectors. Since the code indices represent codebook vectors in a spatial frequency domain, decode table 52 implements a pre-computed inverse discrete cosine transform so that the reconstruction vectors are in a pixel domain. Image assembler 53 converts the reconstruction vectors into blocks and assembles the reconstructed image from the blocks.

Preferably, decoder DEC is implemented in software on a receiving computer. The software allows the fidelity versus bit rate tradeoff to be selected. The software then sets code pruner 51 according to the selected code precision. The software includes separate tables for each setting of code pruner 51. On the table corresponding to the current setting of code pruner 51 is loaded into fast memory (RAM). Thus, lookup table 52 is smaller when pruning is activated. Thus, the pruning function allows fast memory to be conserved to match: 1) the capacity of the receiving computer; or 2) the allotment of local memory to the decoding function.

Figure 2:
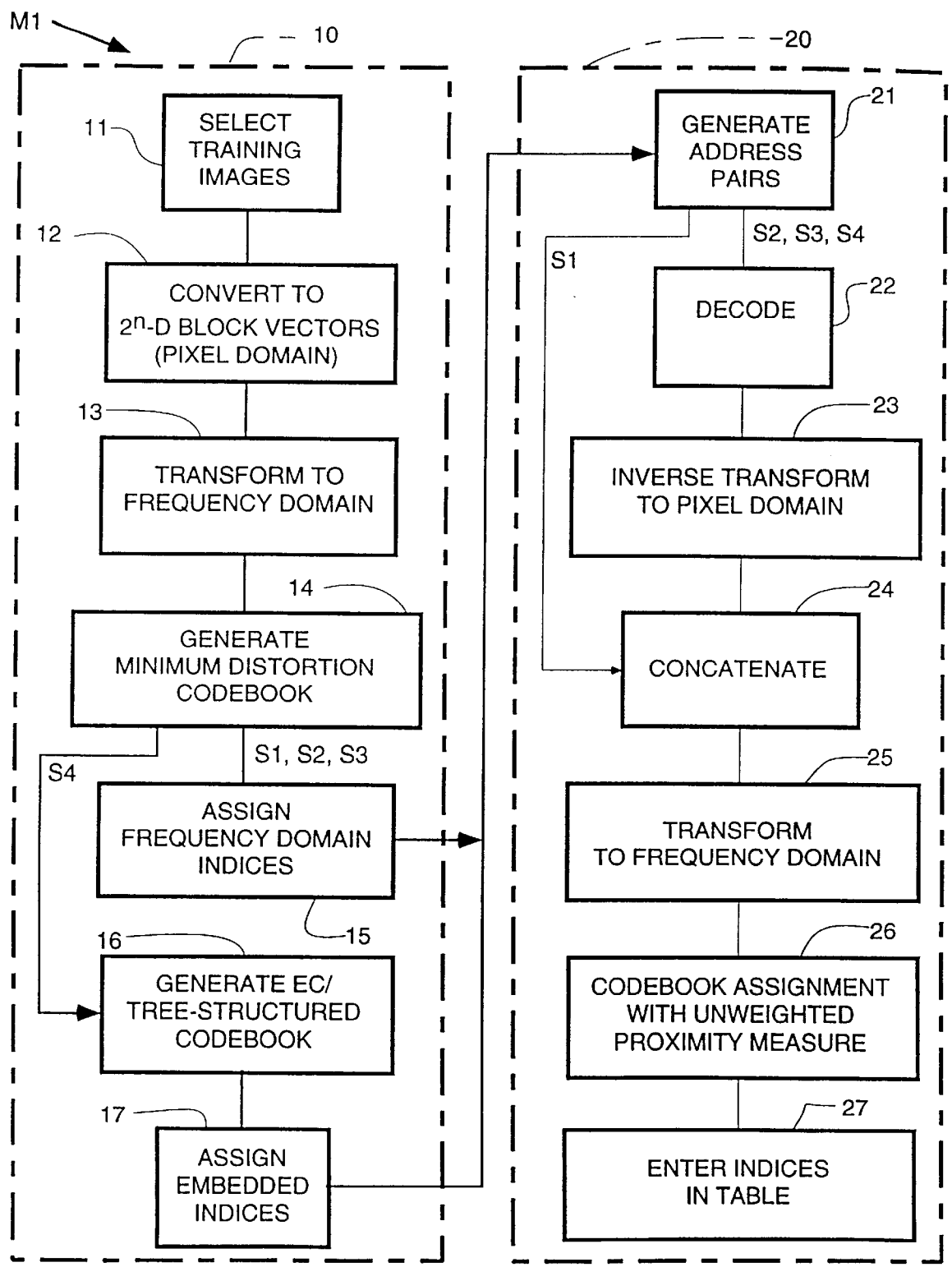
FIG. 2 is a flow chart for designing the compression system of FIG. 1 in accordance with the present invention.

A table design method M1, flow charted in FIG. 2, is executed for each stage of hierarchical lookup table HLT, with some variations depending on whether the stage is the first stage S1, an intermediate stage S2, S3, or the final stage S4. For each stage, method M1 includes a codebook design procedure 10 and a table fill-in procedure 20. For each stage, fill-in procedure 20 must be preceded by the respective codebook design procedure 10. However, there is no chronological order imposed between stages; for example, table T3 can be filled in before the codebook for table T2 is designed.

For first-stage table T1, codebook design procedure 10 begins with the selection of training images at step 11. The training images are selected to be representative of the type or types of images to be compressed by system A1. If system A1 is used for general purpose image compression, the selection of training images can be quite diverse. If system A1 is used for a specific type of image, e.g., line drawings or photos, then the training images can be a selection of images of that type. A less diverse set of training images allows more faithful image reproduction for images that are well matched to the training set, but less faithful image reproduction for images that are not well matched to the training set.

The training images are divided into 2×1 blocks, which are represented by two-dimensional vectors (Vj,V(J+1)) in a spatial pixel domain at step 12. For each of these vectors Vj characterizes the intensity of the left pixel of the 2×1 block and V(J+1) characterizes the intensity of the right pixel of the 2×1 block.

In alternative embodiments of the invention, codebook design and table fill in are conducted in the spatial pixel domain. For these pixel domain embodiments, steps 13, 23, 25 are not executed for any of the stages. A problem with the pixel domain is that the terms of the vector are of equal importance: there is no reason to favor the intensity of the left pixel over the intensity of the right pixel, and vice versa. For table T1 to reduce data while preserving as much information relevant to classification as possible, it is important to express the information so that more important information is expressed independently of less important information.

For the design of the preferred first-stage table T1, a discrete cosine transform is applied at step 13 to convert the two-dimensional vectors in the pixel domain into two-dimensional vectors in a spatial frequency domain. The first value of this vector corresponds to the average intensities of the left and the right pixels, while the second value of the vector corresponds to the difference in intensities between the left and the right pixels.

From the perspective of a human perceiver, expressing the 2×1 blocks of an image in a spatial frequency domain divides the information in the image into a relatively important term (average intensity) and a relatively unimportant term (difference in intensity). An image reconstructed on the basis of the average intensity alone would appear less distorted than an image reconstructed on the basis of the left or right pixels alone; either of the latter would yield an image which would appear less distorted than an image reconstructed on the basis of intensity differences alone. For a given average precision, perceived distortion can be reduced by allotting more bits the more important dimensions and fewer to the less important dimension.

The codebook is designed at step 14. The codebook indices are preferably fixed length, in this case ten bits. Maximal use of the fixed precision is attained by selecting the associated power of two as the number of codebook vectors. In the present case, the number of codebook vectors for table T1 is to be $2^{10}$=1024.

Ideally, step 14 would determine the set of 1024 vectors that would yield the minimum distortion for images having the expected probability distribution of 2×1 input vectors. While the problem of finding the ideal codebook vectors can be formulated, it cannot be solved generally by numerical methods. However, there is an iterative procedure that converges from an essentially arbitrary set of "seed" vectors toward a "good" set of codebook vectors. This procedure is known alternatively as the "cluster compression algorithm", the "Linde-Buzo-Gray" algorithm, and the "generalized Lloyd algorithm" (GLA).

The procedure begins with a set of seed vectors. The training set of 2×1 spatial frequency vectors generated from the training images are assigned to the seed vectors on a proximity basis. This assignment defines clusters of training vectors around each of the seed vectors. The weighted mean vector for each cluster replaces the respective seed vector. The mean vectors provide better distortion performance than the seed vectors; a first distortion value is determined for these first mean vectors.

Further improvement is achieved by re-clustering the training vectors around the previously determined mean vectors on a proximity basis, and then finding new mean vectors for the clusters. This process yields a second distortion value less than the first distortion value. The difference between the first and second distortion values is the first distortion reduction value. The process can be iterated to achieve successive distortion values and distortion reduction values. The distortion values and the distortion reduction values progressively diminish. In generally, the distortion reduction value does not reach zero. Instead, the iterations can be stopped when the distortion reduction values fall below a predetermined threshold—i.e., when further improvements in distortion are not worth the computational effort.

One restriction of the GLA algorithm is that every seed vector should have at least one training vector assigned to it. To guarantee this condition is met, Linde, Buzo, and Gray developed a "splitting" technique for the GLA. See Y. Linde, A. Buzo, and R. M. Gray in "An algorithm for vector quantization Design", *IEEE Transactions on Communications,* COM-28:84–95, January, 1980, and *An Introduction to Data Compression* by Khalid Sayood, Morgan Kaufmann Publishers, Inc., San Francisco, Calif., 1996, pp. 222–228.

This splitting technique begins by determining a mean for the set of training vectors. This can be considered the result of applying a single GLA iteration to a single arbitrary seed vector as though the codebook of interest were to have one vector. The mean vector is perturbed to yield a second "perturbed" vector. The mean and perturbed vectors serve as the two seed vectors for the next iteration of the splitting technique. The perturbation is selected to guarantee that some training vectors will be assigned to each of the two seed vectors. The GLA is then run on the two seed vectors until the distortion reduction value falls below threshold. Then each of the two resulting mean vectors are perturbed to yield four seed vectors for the next iteration of the splitting technique. The splitting technique is iterated until the desired number, in this case 1024, of codebook vectors is attained.

If the reconstructed images are to be viewed by humans and a perceptual profile is available, the distortion and proxmity measures used in step 14 can be perceptually weighted. For example, lower spatial frequency terms can be given more weight than higher spatial frequency terms. In addition, since this is vector rather than scalar quantization, interactive effects between the spatial frequency dimensions can be taken into account. Unweighted measures can be used if the transform space is perceptually linear, if no perceptual profile is available, or the decompressed data is subject to further numeric processing before the image is presented for human viewing.

The codebook designed in step 14 comprises a set of 1024 2×1 codebook vectors in the spatial frequency domain. These are arbitrarily assigned respective ten-bit indices at step 15. This completes codebook design procedure 10 of method M1 for stage S1.

Fill-in procedure 20 for stage S1 begins with step 21 of generating each distinct address to permit its contents to be determined. In the preferred embodiment, values are input into each of the tables in pairs. In alternative embodiments, some tables or all tables can have more inputs. For each table, the number of addresses is the product of the number of possible distinct values that can be received at each input. Typically, the number of possible distinct values is a power of two. The inputs to table T1 receive an eight bit input VJ and eight-bit input V(J+1); the number of addresses for table T1 is thus $2^8*2^8=2^{16}=65,536$. The steps following step 21 are designed to enter at each of these addresses one of the $2^8=256$ table T1 indices Wj.

Each input Vj is a scalar value corresponding to an intensity assigned to a respective pixel of an image. These inputs are concatenated at step 24 in pairs to define a two-dimensional vector (VJ, V(J+1)) in a spatial pixel domain. (Steps 22 and 23 are bypassed for the design of first-stage table T1.)

For a meaningful proximity measurement, the input vectors must be expressed in the same domain as the codebook vectors, i.e., a two-dimensional spatial frequency domain. Accordingly, a DCT is applied at step 25 to yield a two-dimensional vector in the spatial frequency domain of the table T1 codebook.

The table T1 codebook vector closest to this input vector is determined at step 26. The proximity measure is unweighted mean square error. Better performance is achieved using an objective measure like unweighted mean square error as the proximity measure during table building rather than a perceptually weighted measure. On the other hand, an unweighted proximity measurement is not required in general for this step. Preferably, however, the measurement used during table fill at step 26 is weighted less on the average than the measures used in step 14 for codebook design.

At step 27, the index Wj assigned to the closest codebook vector at step 16 is then entered as the contents at the address corresponding to the input pair (Vj, V(j+1)). During operation of system T1, it is this index that is output by table T1 in response to the given pair of input values. Once indexes Wj are assigned to all 65,536 addresses of table T1, method M1 design of table T1 is complete.

For second-stage table T2, the codebook design begins with step 11 of selecting training images, just as for first-stage table T1. The training images used for design of the table T1 codebook can be used also for the design of the second stage codebook. At step 12, the training images are divided into 2×2 pixel blocks; the 2×2 pixel blocks are expressed as image vectors in four-dimensional vector space in a pixel domain; in other words, each of four vector values characterizes the intensity associated with a respective one of the four pixels of the 2×2 pixel block.

At step 13, the four-dimensional vectors are converted using a DCT to a spatial frequency domain. Just as a four-dimensional pixel-domain vector can be expressed as a 2×2 array of pixels, a four-dimensional spatial frequency domain vector can be expressed as a 2×2 array of spatial frequency functions

| F00 | F01 |
| F10 | F11 |

The four values of the spatial frequency domain respectively represent: F00)—an average intensity for the 2×2 pixel block; F01)—an intensity difference between the left and right halves of the block; F10)—an intensity difference between the top and bottom halves of the block; and F11)—a diagonal intensity difference. The DCT conversion is lossless (except for small rounding errors) in that the spatial pixel domain can be retrieved by applying an inverse DCT to the spatial frequency domain vector.

The four-dimensional frequency-domain vectors serve as the training sequence for second stage codebook design by the LBG/GLA algorithm. The proximity and distortion measures can be the same as those used for design of the codebook for table T1. The difference is that for table T2, the measurements are performed in a four-dimensional space instead of a two-dimensional space. Eight-bit indices Xj are assigned to the codebook vectors at step 15, completing codebook design procedure 10 of method M1.

Fill-in procedure 20 for table T2 involves entering indices Xj as the contents of each of the table T2 addresses. As shown in FIG. 1, the inputs to table T2 are to be ten-bit indices Wj from the outputs of table T1. These are received in pairs so that there are $2^{10}*2^{10}=2^{20}=1,048,576$ addresses for table T2. Each of these must be filled with a respective one of $2^{10}=1024$ ten-bit table T2 indices Xj.

Looking ahead to step 26, the address entries are to be determined using a proximity measure in the space in which the table T2 codebook is defined. The table T2 codebook is defined in a four-dimensional spatial frequency domain space. However, the address inputs to table T2 are pairs of indices (Wj,W(J+1)) for which no meaningful metric can be applied. Each of these indices corresponds to a table T1 codebook vector. Decoding indices (Wj,W(J+1)) at step 22 yields the respective table T1 codebook vectors, which are defined in a metric space.

However, the table T1 codebook vectors are defined in a two-dimensional space, whereas four-dimensional vectors are required by step 26 for stage S2. While two two-dimensional vectors frequency domain can be concatenated to yield a four-dimensional vector, the result is not meaningful in the present context: the result would have two values corresponding to average intensities, and two values corresponding to left-right difference intensities; as indicated above, what would be required is a single average intensity value, a single left-right difference value, a single top-bottom difference value, and a single diagonal difference value.

Since there is no direct, meaningful method of combining two spatial frequency domain vectors to yield a higher dimensional spatial frequency domain vector, an inverse DCT is applied at step 23 to each of the pair of two-dimensional table T1 codebook vectors yielded at step 22. The inverse DCT yields a pair of two-dimensional pixel-domain vectors that can be meaningfully concatenated at step 24 to yield a four-dimensional vector in the spatial pixel domain representing a 2×2 pixel block. A DCT transform can be applied, at step 25, to this four-dimensional pixel domain vector to yield a four-dimensional spatial frequency domain vector. This four-dimensional spatial frequency domain vector is in the same space as the table T2 codebook vectors. Accordingly, a proximity measure can be meaningfully applied at step 26 to determine the closest table T2 codebook vector.

The index Xj assigned at step 15 to the closest table T2 codebook vector is assigned at step 27 to the address under consideration. When indices XJ are assigned to all table T2 addresses, table design method M1 for table T2 is complete.

Table design method M1 for intermediate stage S3 is similar to that for intermediate stage S2, except that the dimensionality is doubled. Codebook design procedure 20 can begin with the selection of the same or similar training images at step 11. At step 12, the images are converted to eight-dimensional pixel-domain vectors, each representing a 4×2 pixel block of a training image.

A DCT is applied at step 13 to the eight-dimensional pixel-domain vector to yield an eight-dimensional spatial frequency domain vector. The array representation of this vector is:

| F00 | F01 | F02 | F03 |
| F10 | F11 | F12 | F13 |

Although basis functions F00, F01, F10, and F11 have roughly, the same meanings as they do for a 2×2 array, once the array size exceeds 2×2, it is no longer adequate to describe the basis functions in terms of differences alone. Instead, the terms express different spatial frequencies. The functions, F00, F01, F02, F03, in the first row represent increasingly greater horizontal spatial frequencies. The functions F00, F01, in the first column represent increasingly greater vertical spatial frequencies. The remaining functions can be characterized as representing two-dimensional spatial frequencies that are products of horizontal and vertical spatial frequencies.

Human perceivers are relatively insensitive to higher spatial frequencies. Accordingly, a perceptual proximity measure might assign a relatively low (less than unity) weight to high spatial frequency terms such as F03 and F13. By the same reasoning, a relatively high (greater than unity) weight can be assigned to low spatial frequency terms.

The perceptual weighting is used in the proximity and distortion measures during codebook assignment in step 14. Again, the splitting variation of the GLA is used. Once the 256 word codebook is determined, indices Yj are assigned at step 15 to the codebook vectors.

Table fill-in procedure 20 for table T3 is similar to that for table T2. Each address generated at step 21 corresponds to a pair (XJ, X(J+1)) of indices. These are decoded at step 22 to yield a pair of four-dimensional table T2 spatial-frequency domain codebook vectors at step 22. An inverse DCT is applied to these two vectors to yield a pair of four-dimensional pixel-domain vectors at step 23. The pixel domain vectors represent 2×2 pixel blocks which are concatenated at step 24 so that the resulting eight-dimensional vector in the pixel domain corresponds to a 4×2 pixel block. At step 25, a DCT is applied to the eight-dimensional pixel domain vector to yield an eight-dimensional spatial frequency domain vector in the same space as the table T3 codebook vectors.

The closest table T3 codebook vector is determined at step 26, preferably using an unweighted proximity measure such as mean-square error. The table T3 index Yj assigned at step 15 to the closest table T3 codebook vector is entered at the address under consideration at step 27. Once corresponding entries are made for all table T3 addresses, design of table T3 is complete.

Table design method M1 for final-stage table T4 can begin with the same or a similar set of training images at step 11. The training images are expressed, at step 12, as a sequence of sixteen-dimensional pixel-domain vectors representing 4×4 pixel blocks (having the form of B1 in FIG. 1). A DCT is applied at step 13 to the pixel domain vectors to yield respective sixteen-dimensional spatial frequency domain vectors, the statistical profile of which is used to build the final-stage table T4 codebook.

Instead of building a standard table-based VQ codebook step as for stage S1, S2, and S3, step 16 builds a tree-structured codebook. The main difference between tree-structured codebook design and the full-search codebook design used for the preliminary stages is that most of the codebook vectors are determined using only a respective subset of the training vectors.

Figure 3:
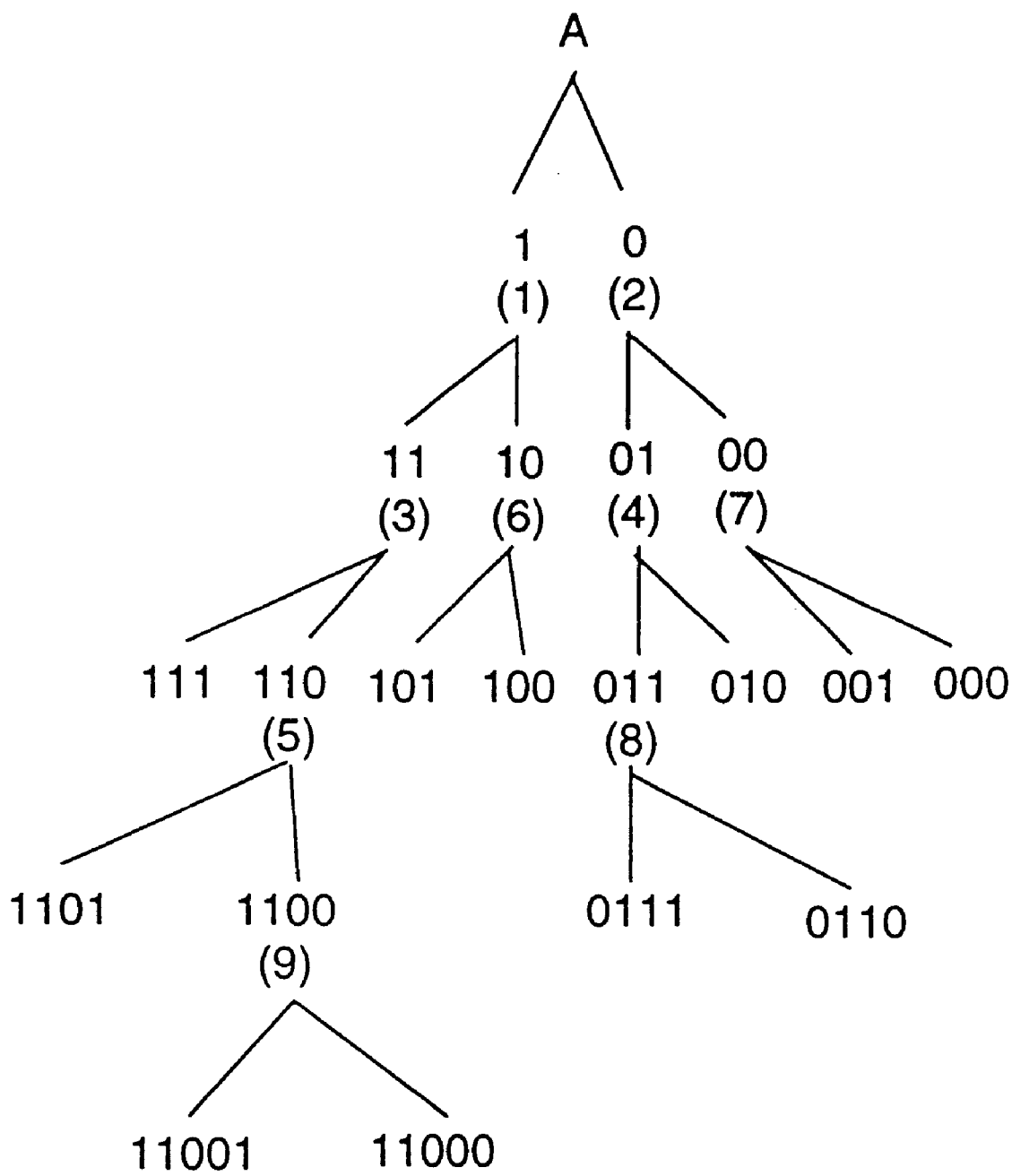
FIG. 3 is a schematic illustration of a decision tree for designing an embedded code for the system of FIG. 1.

As in the splitting variation, the mean, indicated at A in FIG. 3, of the training vectors is determined. For stage S4, the training vectors are in a sixteen-dimensional spatial frequency domain. The mean is perturbed to yield seed vectors for a two-vector codebook. The GLA is run to determine the codebook vectors for the two-vector codebook.

In a departure from the design of the preliminary section codebooks, the clustering of training vectors to the two-vector-codebook vectors is treated as permanent. Indices 0 and 1 are assigned respectively to the two-vector-codebook vectors, as shown in FIG. 3. Each of the two-vector-codebook vectors are perturbed to yield two pairs of seed vectors. For each pair, the GLA is run using only the training vectors assigned to its parent codebook vector. The result is a pair of child vectors for each of the original two-vector-codebook vectors. The child vectors are assigned indices having as a prefix the index of the parent vector and a one bit suffix. The child vectors of the codebook vector assigned index 0 vector are assigned indices 00 and 01, while the child vectors of 1 codebook vector are assigned indices 10 and 11. Once again, the assignment of training vectors to the four child vectors is treated as permanent.

There are "evenly-growing" and "greedily-growing" variations of decision-tree growth. In either case, it is desirable to overgrow the tree and then prune back to a tree of the desired precision. In the evenly-growing variation, both sets of children are retained as used in selecting seeds for the next generation. Thus, the tree is grown generation-by-generation. Growing an evenly-grown tree to the maximum possible depth of the desired variable-length code can consume more memory and computation time than is practical.

Less growing and less pruning are required if the starting point for the pruning has the same general shape as the tree that results from the pruning. Such a tree can be obtained by the preferred "greedily-growing" variation, in which growth is node-by-node. In general, the growth is uneven, e.g., one sibling can have grandchildren before the other sibling has children. The determination of which childless node is the next to be grown involves computing a joint measure $D+\lambda H$ for the increase in distortion D and in entropy H that would result from a growth at each childless node. Growth is promoted only at the node with the lowest joint measure. Note that the joint measure is only used to select the node to be grown; in the preferred embodiment, entropy is not taken into account in the proximity measure used for clustering. However, the invention provides for an entropy-constrained proximity measure.

In the example, joint entropy and distortion measures are determined for two three-vector codebooks, each including an aunt and two nieces. One three-vector codebook includes vectors 0, 10, and 11; the other three-vector codebook includes vectors 1, 00, and 01. The three-vector codebook with the lower joint measure supersedes the two-vector codebook. Thus, the table T4 codebook is grown one vector at a time (instead of doubling each iteration as with the splitting procedure.) In addition, the parent that was replaced by her children is assigned an ordinal. In the example of FIG. 3, the lower distortion is associated with the children of vector 1. The three vector codebook consists of vectors 11, 10, and 0. The ordinal 1 (in parenthesis in FIG. 3) is assigned to the replaced parent vector 1. This ordinal is used in selecting compression scaling.

In the next iteration of the tree-growing procedure, the two new codebook vectors, e.g., 11 and 10, are each perturbed so that two more pairs of seed vectors are generated. The GLA is run on each pair using only training vectors assigned to the respective parent. The result is two pairs of proposed new codebook vectors (111, 110) and (101,100). Distortion measures are obtained for each pair. These distortions measures are compared with the already obtained distortion measure for the vector, e.g., 0, common to the two-vector and three-vector codebooks. The tree is grown from the codebook vector for which the growth yields the least distortion. In the example of FIG. 3, the tree is grown from vector 0, which is assigned the ordinal 2.

With each iteration of the growing technique, one parent vector is replaced by two child vectors, so that the next level codebook has one more vector that the preceding level codebook. Indices for the child vectors are formed by appending 0 and 1 respectively to the end of the index for the parent vector. As a result, the indices for each generation are one longer than the indices for the preceding generation. The code thus generated is a "prefix" code. FIG. 3 shows a tree after nine iterations of the tree-growing procedure.

Optionally, tree growth can terminate with a tree with the desired number, of end nodes corresponding to codebook vectors is achieved. However, the resulting tree is typically not optimal. To obtain a more optimal tree, growth continues well past the size required for the desired codebook. For example, the average bit length for codes associated with the overgrown three can be twice the average bit length desired for the tree to be used for the maximum precision code. The overgrown tree can be pruned node-by-node using a joint measure of distortion and entropy until a tree of the desired size is achieved. Note that the pruning can also be used to obtain an entropy shaped tree from an evenly overgrown tree.

Lower precision trees can be designed by the ordinals assigned during greedy growing. There may be some gaps in the numbering sequence, but a numerical order is still present to guide selection of nodes for the lower-precision trees. Preferably, however, the high-precision tree is pruned using the joint measure of distortion and entropy to provide better low-precision trees. To the extent of the pruning, ordinals can be reassigned to reflect pruning order rather than the growing order. If the. pruning is continued to the common ancestor and its children, then all ordinals can be reassigned according to pruning order.

The full-precision-tree codebook provides lower distortion and a lower bit rate than any of its predecessor codebooks. If a higher bit rate is desired, one can select a suitable ordinal and prune all codebook vectors with higher ordinals. The resulting predecessor codebook provides a near optimal tradeoff of distortion and bit rate. In the present case, a 1024-vector codebook is built, and its indices are used for index ZA. For index ZB, the tree is pruned back to ordinal 512 to yield a higher bit rate. For ZC, the index is pruned back to ordinal 256 to yield an even higher bit rate. Note that the code pruner 51 of decoder DEC has information regarding the ordinals to allow it to make appropriate bit-rate versus distortion tradeoffs.

While indices ZA, ZB, and ZC could be entered in sections of respective addresses of table T4, doing so would not be memory efficient. Instead ZC, Zb, and Za are stored. Zb indicates the bits to be added to index ZC to obtain index ZB. Za indicates the bits to be added to index ZB to obtain index ZA.

Fill-in procedure 20 for table T4 begins at step 21 with the generation of the $2^\circ$ addresses corresponding to all possible distinct pairs of inputs (Y1, Y2). Each third stage index Yj is decoded at step 22 to yield the respective eight-dimensional spatial-frequency domain table T3 codebook vector. An inverse DCT is applied at step 23 to these table T3 codebook vectors to obtain the corresponding eight-dimensional pixel domain vectors representing 4×2 pixel blocks. These vectors are concatenated at step 24 to form a sixteen-dimensional pixel-domain vector corresponding to a respective 4×4 pixel block. A DCT is applied at step 24 to yield a respective sixteen-dimensional spatial frequency domain vector in the same space as the table T4 codebook.

The closest table T4 codebook vector in each of the three sets of codebook vectors are identified at step 26, using an unweighted proximity measure. The class indices ZA, ZB, and AC associated with the closest codebook vectors are assigned to the table T4 address under consideration. Once this assignment is iterated for all table T4 addresses, design of table T4 is complete. Once all tables T1–T4 are complete, design of hierarchical table HLT is complete.

Figure 4:
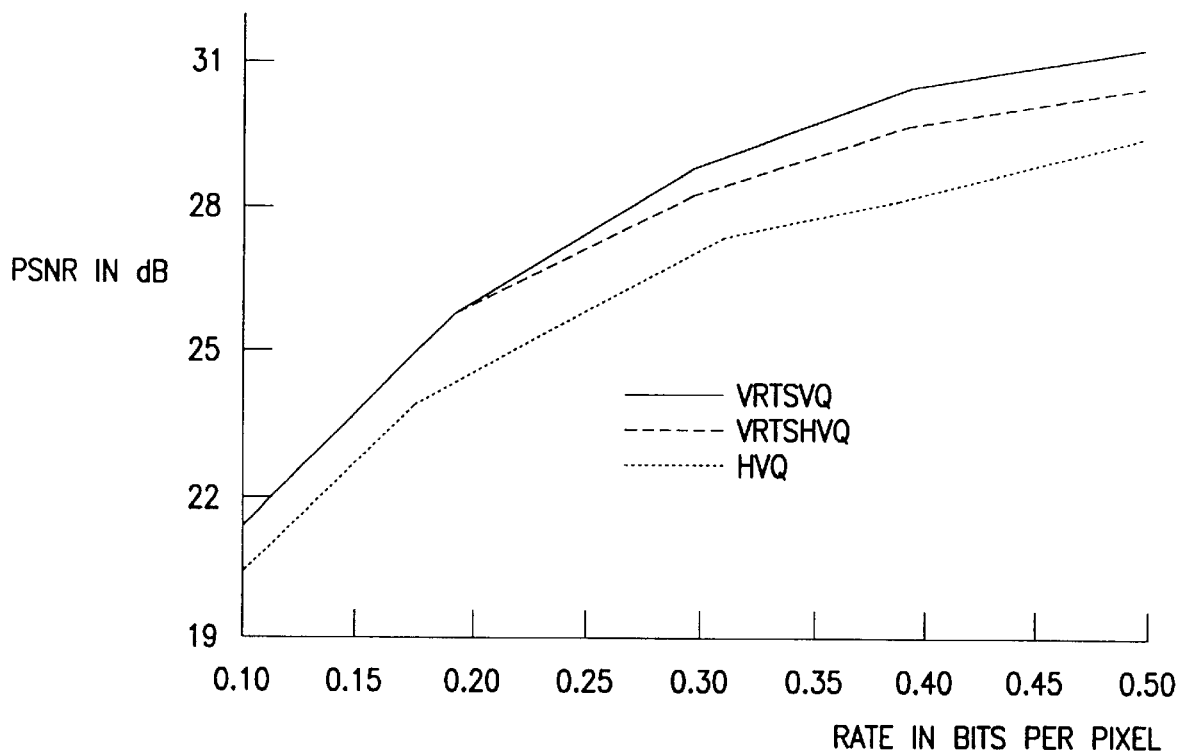
FIG. 4 is a graph indicating the performance of the system of FIG. 1.

The performance of the resulting compression system is indicated in FIG. 4 for the variable-rate tree-structured hierarchical table-based vector quantization (VRTSHVQ) compression case of the preferred embodiment. It is noted that the compression effectiveness is slightly worse than for non-hierarchical variable-rate tree-structured table-based vector quantization (VRTSVQ) compression. However, it is significantly better than plain hierarchical vector quantization (HVQ).

More detailed descriptions of the methods for incorporating perceptual measures, a tree-structure, and entropy constraints in a hierarchical VQ lookup table are presented below. To accommodate the increased sophistication of the description, some change in notation is required. The examples below employ perceptual measures during table fill in; in accordance with the present invention, it is maintained that lower distortion is achievable using unweighted measures for table fill in.

The tables used to implement vector quantization can also implement block transforms. In these table lookup encoders, input vectors to the encoders are used directly as addresses in code tables to choose the codewords. There is no need to perform the forward or reverse transforms. They are implemented in the tables. Hierarchical tables can be used to preserve manageable table sizes for large dimension VQ's to quantize a vector in stages. Since both the encoder and decoder are implemented by table lookups, there are no arithmetic computations required in the final system implementation. The algorithms are a novel combination of any generic block transform (DCT, Haar, WHT) and hierarchical vector quantization. They use perceptual weighting and subjective distortion measures in the design of VQ's. They are unique in that both the encoder and the decoder are implemented with only table lookups and are amenable to efficient software and hardware solutions.

Full-search vector quantization (VQ) is computationally asymmetric in that the decoder can be implemented as a simple table lookup, while the encoder must usually be implemented as an exhaustive search for the minimum distortion codeword. VQ therefore finds application to problems where the decoder must be extremely simple, but the encoder may be relatively complex, e.g., software decoding of video from a CDROM.

Various structured vector quantizers have been introduced to reduce the complexity of a full-search encoder. For example, a transform code is a structured vector quantizer in which the encoder performs a linear transformation followed by scalar quantization of the transform coefficients. This structure also increases the decoder complexity, however, since the decoder must now perform an inverse transform. Thus in transform coding, the computational complexities of the encoder and decoder are essentially balanced, and hence transform coding finds natural application to point-to-point communication, such as video telephony. A special advantage of transform coding is that perceptual weighting, according to frequency sensitivity, is simple to perform by allocating bits appropriately among transform coefficients.

A number of other structured vector quantization schemes decrease encoder complexity but do not simultaneously increase decoder complexity. Such schemes include tree-structured VQ, lattice VQ, fine-to-coarse VQ, etc. Hierarchical table-based vector quantization (HTBVQ) replaces the full-search encoder with a hierarchical arrangement of table lookups, resulting in a maximum of one table lookup per sample to encode. The result is a balanced scheme, but with extremely low computational complexity at both the encoder and decoder. Furthermore, the hierarchical arrangement allows efficient encoding for multiple rates. Thus HVQ finds natural application to collaborative video over heterogeneous networks of inexpensive general purpose computers.

Perceptually significant distortion measures can be integrated into HTBVQ based on weighting the coefficients of arbitrary transforms. Essentially, the transforms are pre-computed and built into the encoder and decoder lookup tables. Thus gained are the perceptual advantages of transform coding while maintaining the computational simplicity of table lookup encoding and decoding.

HTBVQ is a method of encoding vectors using only table lookups. A straightforward method of encoding using table lookups is to address a table directly by the symbols in the input vector. For example, suppose each input symbol is pre-quantized to $r_0=8$ bits of precision (as is typical for the pixels in a monochrome image), and suppose the vector dimension is K=2. Then a lookup table with $Kr_0=16$ address bits and $\log_2 N$ output bits (where N is the number of codewords in the codebook) could be used to encode each two-dimensional vector into the index of its nearest codeword using a single table lookup. Unfortunately, the table size in this straightforward method gets infeasibly large for even moderate K. For image coding, we may want K to be as large as 64, so that we have the possibility of coding each 8×8 block of pixels as a single vector.

By performing the table lookups in a hierarchy, larger vectors can be accommodated in a practical way, as shown in FIG. 1. In the figure, a K=8 dimensional vector at original precisiorn $r_0=8$ bits per symbol is encoded into $r_M=8$ bits per vector (i.e., at rate $R=r_M/K=1$ bit per symbol for a compression ratio of 8:1) using M=3 stages of table lookups. In the first stage, the K input symbols are partitioned into blocks of size $k_0=2$, and each of these blocks is used to directly address a lookup table with $k_0 r_0=16$ address bits to produce $r_1=8$ output bits.

Likewise, in each successive stage m from 1 to M, the $r_m-1$-bit outputs from the previous stage are combined into blocks of length $k_m$ to directly address a lookup table with $k_m r_{m-1}$ address bits to produce $r_m$ output bits per block. The $r_m$ bits output from the final stage M may be sent directly through the channel to the decoder, if the quantizer is a fixed-rate quantizer, or the bits may be used to index a table of variable-length codes, for example, if the quantizer is a variable-rate quantizer. In the fixed-rate case, $r_m$ determines the overall bit rate of the quantizer, $R=r_M/K$ bit per symbol, where $K=K_M=\pi kn$, is the overall dimension of the quantizer. Indeed, at each stage m, $r_m$ determines the bit rate of a fixed-rate quantizer with dimension $$K_m = \prod_{i=1}^{m} k_m.$$

Hence if $k_m=2$ and $r_m=8$ for all m, then after each stage in the hierarchy, the vector dimension $K_m$ doubles and the bit rate $r_m/K_m$ halves, i.e., the compression ratio doubles. Note that the resulting sequence of fixed-rate quantizers can be used for multi-rate coding.

The computational complexity of the encoder is at most one table lookup per input symbol, since there are at most $$\frac{1}{K_m} \leq \frac{1}{2^m}$$

table lookups per input symbol in the mth stage, and $$\sum_{m=1}^{M} 2^{-m} \leq 1.$$

The storage requirements of the encoder are $2^{k_m r_{m-1}} \times r_m$ bits for a table in the mth stage. If $k_m=2$ and $r_m=8$ for all m, then each table is a 64 Byte table, so that assuming all the tables within a stage are identical, only one 64 KByte table is required for each of the $M=\log_2 K$ stages of the hierarchy. Clearly many possible values for $k_m$ and $r_m$ are possible, but $k_m=2$ and $r_m=8$ are usually most convenient for the purposes of implementation. The following description can be extrapolated to cover the other values.

The main issue to address at this point is the design of the tables' contents. The table at stage can be regarded as a mapping from two input indices $i_1^{m-1}$ and $i_2^{m-1}$, each in $\{0,1 \ldots, 255\}$, to an output index $i^m$ also in $\{0,1, \ldots 255\}$. With respect to a distortion measure $d_m(x, \hat{x})$ between vectors of dimension $K_m=2^m$, design a fixed-rate VQ codebook $\beta_m(i)$, $i=0,1, \ldots, 255$ with dimension $K_m=2^m$ and rate $r_m/K_m=8/2^m$ bits per symbol, trained on the original data using any convenient VQ design algorithm (such as the generalized Lloyd algorithm). Then set $i^m(i_1^{m-1}, i_2^{m-1}) = \mathrm{argmin}_i d_m((\beta_{m-1}(i_1^{m-1}), \beta_{m-1}(i_2^{m-1})), \beta_m(i))$ to be the index of the $2^m$-dimensional codeword closest to the $2^m$-dimensional vector constructed by concatenating the $2^{m-1}$-dimensional codewords $\beta(i_1^{m-1})$ and $\beta(i_2^{m-1})$. The intuition behind this construction is that if $\beta_{m-1}(i_1^{m-1})$ is a good representative of the first half of the $2^m$-dimensional input vector, and $\beta_{m-1}(i_2^{m-1})$ is a good representative of the second half, then $\beta_m(i^m)$, with $i^m$ defined above, will be a good representative of both halves, in the codebook $\beta_m(i)$, i=0,1, . . . ,255.

An advantage of HTBVQ is that complexity of the encoder does not depend on the complexity of the distortion measure, since the distortion measure is pre-computed into the tables. Hence HTBVQ is ideally suited to implementing perceptually meaningful, if complex, distortion measures.

Let d'(x, $\hat{x}$) be an arbitrary non-negative distortion measure on $\Re^K \Re^K$ such that for each x, d'(x,$\hat{x}$) as a function of $\hat{x}$ is zero at $\hat{x}$=x and is twice continuously differentiable in $\hat{x}$ at x. Then d'(x, $\hat{x}$) as a function of $\hat{x}$ has a Taylor series expansion around x in which the constant and first order terms are zero, and the quadratic term is non-negative semi-definite. Hence the distortion measure may be approximated by the input-weighted squared error d(x, $\hat{x}$)=(x−, $\hat{x}$) $iM_x(x-\hat{x})$ where $x^t$ denotes the transpose of x and $M_x$ is the matrix of second derivatives of d'(x, $\hat{x}$) as a function of $\hat{x}$ at x divided by 2. Since $M_x$ is symmetric and non-negative semi-definite, it may be diagonalized to a matrix of its non-negative eigenvalues, say $$d(x, \hat{x}) = (Tx - T\hat{x})^t W_x (Tx - T\hat{x})$$
$$= \sum_{j=1}^{K} w_j(w_j(y_j - \hat{y}_j))^2$$
$$= d_r(y, \hat{y}) M_x$$
$$= T_x^t W_x T_x,$$

where $W_x=(w_1, \ldots, w_k)$ and K is the dimension of $\hat{x}$.

If the diagonalizing matrix $T_x$ (of normalized eigenvectors of $W_x$) does not depend on x, then $$d(x, \hat{x}) = (Tx - T\hat{x})^t W_x (Tx - T\hat{x})$$
$$= \sum_{j=1}^{K} w_j(w_j(y_j - \hat{y}_j))^2$$
$$= d_r(y, \hat{y})$$

where $y_j$ and $\hat{y}_j$ are the components of y=Tx and $\hat{y}$=T$\hat{x}$, respectively. That is, the distortion is the weighted sum of squared differences between the transform coefficients y and $\hat{y}$. We shall henceforth assume that T is the transformation matrix of some fixed transform, such as the Haar, Walsh-Hadamard, or discrete cosine transform, and we shall let the weights $W_x$ vary arbitrarily with x. This is a reasonably general class of perceptual distortion measures.

When there is no weighting, i.e., when $W_x$=I, then d(x, $\hat{x}$)=$\|Tx-T\hat{x}\|$=$\|x-\hat{x}\|^2$ regardless of the orthogonal transformation T. This is because the rows (and columns) of T are orthonormal, and therefore T is a distance-preserving rotation and/or reflection. Hence when the weighting is uniform, the squared error in the transformed space equals the squared error in the original space, regardless of whether the transform is the Haar transform (HT), Walsh-Hadamard transform (WHT), discrete cosine transform (DCT), etc. Indeed, full-search VQ codebooks designed in transform space to minimize the mean squared error for different transforms T are all equivalent, since their codewords are simple rotations and/or reflections of each other. The energy compaction criterion so crucial to determining the best transform for scalar quantization of the coefficients is irrelevant for determining the best transform for vector quantization of the coefficients, when the weights are uniform.

When the weights are not uniform, different orthogonal transformations result in different distortion measures. Thus nonuniform weights play an essential role in this class of perceptual distortion measures.

The weights reflect human visual sensitivity to quantization errors in different transform coefficients, or bands. The weights may be input-dependent to model masking effects. When used in the perceptual distortion measure for vector quantization, the weights control an effective stepsize, or bit allocation, for each band. Consider uniform scalar quantization of the transform coefficients, as in JPEG, for example. By setting the stepsizes $s_1, s_K$ of the scalar quantizers for each of the K bands, bits are allocated between bands in accordance with the strength of the signal in the band and an appropriate perceptual model. The encoding regions of the resulting product code are hyper-rectangles with side $s_j$ along the jth axis, j=1, . . . ,K.

When the transform coefficients are vector quantized with respect to a weighted squared error distortion measure, the weights $w_1, \ldots, W_K$ play a role corresponding to the stepsizes. The weighted distortion measure (in the transform domain) $d_t(y, \hat{y})$ equals $\Sigma\|w_j^{0.5}y_j - w_j^{0.5}\hat{y}_j\|^2$, which is the ordinary (unweighted) squared error of a transform whose K coefficients have been scaled by the factors $w_j^{0.5}$, j=1 . . . , K. In this scaled transform space, the vector quantizer with the minimum mean squared error subject to an entropy constraint has a uniform codeword density (at least for large numbers of codewords), so that each encoding cell has the same volume V in K-space. Hence each encoding cell has linear dimension $V^{1/K}$ (times a sphere packing coefficient less than 1) in the scaled space. In the unscaled space, each encoding cell has roughly linear dimension $-w_j^{0.5}V^{1/K}$ along the jth coordinate. Thus the square roots of the weights $w_j$, j=1, . . . ,K, correspond to the inverse of the scale factors, j=1, . . . ,K, or wj $s_j^2$. One way to derive a perceptual distortion measure is to use the DCT for the transformation matrix and the squared inverse of the JPEG stepsizes for the weights.

HTBVQ can be combined with block based transforms like the DCT, the Haar and the Walsh-Hadamard Transform, perceptually weighted to improve visual performance. Herein the combination is referred to as Weighted Transform HVQ (WTHVQ). Here, we apply WTHVQ to image coding.

The encoder of a WTHVQ consists of M stages (as in FIG. 1), each stage being implemented by a lookup table. For image coding, separable transforms are employed, so the odd stages operate on the rows while the even stages operate on the columns of the image. The first stage combines $k_1$=2 horizontally adjacent pixels of the input image as an address to the first lookup table. This first stage corresponds to a 2×1 transform on the input image followed by perceptually weighted vector quantization using a subjective distortion measure, with 256 codewords. Thus the rate is halved at each stage of the WTHVQ. The first stage gives a compression of 2:1.

The second stage combines $k_2$=2 outputs of the first stage that are vertically adjacent as an address to the second stage lookup table. The second stage corresponds to a 2×2 transform on the input image followed by perceptually weighted vector quantization using a subjective distortion measure, with 256 codewords. The only difference is that the 2×2 vector is quantized successively in two stages. The compression achieved after the second stage is 4:1.

In stage i, 1<i ≦M, the address for the table is constructed by using $k_i$=2 adjacent outputs of the previous stage and the addressed content is directly used as the address for the next stage. Stage i corresponds to a $2^{i/2} \times 2^{i/2}$ perceptually weighted transform, for i even, or a $2^{(i+1)/2} \times 2^{(i-1)/2}$ transform, for i odd, followed by a perceptually weighted vector quantizer using a subjective distortion measure with 256 codewords. The only difference is that the quantization is performed successively in i stages. The compression achieved after stage i is $2^i:1$. Thus the overall vector dimension is $$K = \sum_{i=1}^{M} k_j.$$

The overall compression ratio after the M stages is $2^M:1$. The last stage produces the encoding index u, which represents an approximation to the input (perceptually weighted transform) vector and sends it to the decoder. This encoding index is similar to that obtained in a direct transform VQ with an input weighted distortion measure. The decoder of a WTHVQ is the same as a decoder of such a transform VQ. That is, it is a lookup table in which the reverse transform is done ahead of time on the codewords.

The computational and storage requirements of WTHVQ are same as that of ordinary HVQ. In principle, the design algorithm for WTHVQ is the same as that of ordinary HVQ, but using a perceptual distortion measure. In practice, however, computation savings result by transforming the data and designing the WTHVQ in the transformed space, using orthogonally weighted distortion measure $d_T$.

The design of a WTHVQ consists of two major steps. The first step designs VQ codebooks for each transform stage. Since each perceptually weighted transform VQ stage has a different dimension and rate they are designed separately. A subjectively meaningful distortion measure as described above is used for designing the codebooks.

The codebooks for each stage of the WTHVQ are designed independently by the generalized Lloyd algorithm (GLA) run on the transform of the appropriate order on the training sequence. The first stage codebook with 256 codewords is designed by running GLA on a 2'1 transform (DCT, Haar, or WHT) of the training sequence. Similarly the stage i codebook (256 codewords) is designed using the GLA on a transform of the training sequence of the appropriate order for that stage. The reconstructed codewords for the transformed data using the subjective distortion measure $d_T$ are given by:

$$\hat{y} = \arg\min_y E[d_d(Y, \hat{y})] = (E[W_x])^{-1} E[W_x Y]$$

The original training sequence is used to design all stages by transforming it using the corresponding transforms of the appropriate order for each stage. In reality the corresponding input training sequence to each stage are generally different because each stage has to go through a lot of previous stages and the sequence is quantized successively in each stage and is hence different at each stage.

The second step in the design of WTHVQ builds lookup tables from the designed codebooks. After having built each codebook for the transform the corresponding code tables are built for each stage. The first stage table is built by taking different combinations of two 8-bit input pixels. There are $2^{16}$ such combinations. For each combination a 2×1 transform is performed. The index of the codeword closest to the transform for the combination in the sense of minimum distortion rule (subjective distortion measure $d_T$) is put in the output entry of the table for that particular input combination. This procedure is repeated for all possible input combinations. Each output entry ($2^{16}$ total entries) of the first stage table has 8 bits.

The second stage table operates on the columns. Thus for the second stage the product combination of two first stage tables is taken by taking the product of two 8-bit outputs from the first stage table. There are $2^{16}$ such entries for the second stage table. For a particular entry a successively quantized 2×2 transform is obtained by doing a 2×1 inverse transform on the two codewords obtained by using the indices for the first stage codebook. Now on the 2×2 raw data obtained a 2×2 transform is performed and the index of the codeword closest to this transformed vector in the sense of the subjective distortion measure $d_T$ is put in the corresponding output entry. This procedure is repeated for all input entries in the table. Each output entry for the second stage table also has 8 bits.

The third stage table operates on the rows. Thus for the third stage the product combination of two second stage tables is obtained by taking the product of the output entries of the second stage tables. Each output entry of the second stage table has 8 bits. Thus the total number of different input entries to the third stage table are $2^{16}$. For a particular entry a successively quantized 4×2 transform is obtained by doing a 2×2 inverse transform on the two codewords obtained by using the indices for the second stage codebook. Now on the 4×2 raw data obtained a 4×2 transform is performed and the index of the codeword closest in the sense of the subjective distortion measure $d_T$ to this transformed vector is put in the corresponding output entry.

All remaining stage tables are built in a similar fashion by performing two inverse transforms and then performing a forward transform on the data. The nearest codeword to this transform data in the sense of subjective distortion measure $d_T$ is obtained from the codebook for that stage and the corresponding index is put in the table. The last stage table has the index of the codeword as its output entry which is sent to the decoder. The decoder has a copy of the last stage codebook and uses the index for the last stage to output the corresponding codeword.

A simpler table building procedure can be used for the Haar and the Walsh-Hadamard transforms. This happens because of the nice property of the Haar and WHT that higher order transform can be obtained as a linear combination of a lower order transform on the partitioned data. The table building for the DCT, i.e. the inverse transform method, will be more expensive than the Haar and the WHT because at each stage two inverse transforms and one forward DCT transform must be performed.

Simulation results have been obtained for the for the different HVQ algorithms. The algorithms are compared against JPEG and fill search VQ. Table II gives the PSNR results on the 8-bit monochrome image Lena (512×12) for different compression ratios for JPEG, full-search plain VQ, m full-search unweighted Haar VQ, full-search unweighted WHT VQ and full-search unweighted DCT VQ. The codebooks for the VQ have been generated by training on five different images (Woman1, Woman2, Man, Couple and Crowd).

It can be seen from Table II that the PSNR results of plain VQ and unweighted transform VQ are the same at each compression ratio. This is because the transforms are all orthogonal, any differences are due to the fact that the splitting algorithm in the GLA is sensitive to the coordinate system. JPEG performs around 5 dB better than these schemes since it is a variable rate code. These VQ based algorithms being fixed rate have other advantages compared to JPEG. However by using entropy coding along with these algorithms 25% more compression can be achieved.

TABLE II

PSNR results

| Compression Ratio | JPEG | Plain VQ | Haar VQ | WHT VQ | DCT VQ |
|---|---|---|---|---|---|
| 2:1 | 46.9 | 41.7 | 41.7 | 41.7 | 41.7 |
| 4:1 | 40.8 | 35.9 | 35.8 | 35.8 | 35.8 |
| 8:1 | 37.7 | 32.5 | 32.5 | 32.5 | 32.5 |
| 16:1 | 34.7 | 30.5 | 30.5 | 30.5 | 30.5 |

Table III gives the PSNR results on Lena for different compression f ratios for plain HVQ, unweighted Haar VQ, unweighted WHT HVQ and unweighted DCT HVQ. It can be seen from Table III that the PSNR results of transform HVQ are the same as the plain HVQ results for the same compression ratio. Comparing the results of Table III with Table II we find that the HVQ based schemes perform around 0.7 dB worse than the full search VQ schemes.

TABLE III

PSNR Results of HVQs

| Compression Ratio | HVQ | Haar VQ | WHT VQ | DCT VQ |
|---|---|---|---|---|
| 2:1 | 41.7 | 41.7 | 41.7 | 41.7 |
| 4:1 | 35.3 | 35.3 | 35.3 | 35.3 |
| 8:1 | 31.8 | 31.8 | 31.8 | 31.8 |
| 16:1 | 29.7 | 29.7 | 29.7 | 29.7 |

Table IV gives the PSNR results on Lena for different compression ratios for full search plain VQ, perceptually weighted full search Haar VQ, perceptually weighted full-search WHT VQ and perceptually weighted full search DCT VQ. The weighting increases the subjective quality of the compressed images, though it reduces the PSNR. The subjective quality of the images compressed using weighted VQ's is much better than the unweighted VQ's. Table IV also gives the PSNR results on Lena for different compression ratios for perceptually weighted Haar VQ, WHT HVQ and DCT HVQ. The visual quality of the compressed images obtained using weighted transform HVQ's is significantly higher than for plain HVQ. The quality of the weighted transform VQ's compressed images is about the same as that of the weighted transform HVQ's compressed images.

TABLE IV

PSNR results of Perceptually Weighted VQ's and HVQ's

| Compression Ratio | Plain VQ | Haar VQ | WHT VQ | DCT VQ | Haar HVQ | WHT HVQ | DCT HVQ |
|---|---|---|---|---|---|---|---|
| 2:1 | 41.7 | 39.4 | 39.4 | 39.4 | 40.0 | 40.0 | 40.0 |
| 4:1 | 35.9 | 35.1 | 35.1 | 35.1 | 34.8 | 34.8 | 34.8 |
| 8:1 | 32.5 | 31.8 | 31.8 | 31.9 | 31.6 | 31.6 | 31.7 |
| 16:1 | 30.5 | 29.9 | 29.9 | 30.0 | 29.8 | 29.8 | 29.8 |

Table V gives the encoding times of the different algorithms on a SUN Sparc-10 workstation on Lena. It can be seen from Table V that the encoding times of the transform HVQ and plain HVQ are same. It takes 12 ms for the first stage encoding, 24 ms for the second stage encoding and so on. On the other hand JPEG requires 250 ms for encoding at all compression ratios. Thus the HVQ based encoders are 10–25 times faster than a JPEG encoder. The HVQ based encoders are also around 50–100 times faster than full search VQ based encoders. This low computational complexity of HVQ is very useful for collaborative video over heterogeneous networks. It makes 30 frames per second software only video encoding possible on general purpose workstations.

TABLE V

Encoding times in ms of different algorithms

| Compression Ratio | Transform HVQ | Transform VQ | HVQ | VQ | JPEG |
|---|---|---|---|---|---|
| 2:1 | 12 | 900 | 12 | 800 | 250 |
| 4:1 | 24 | 900 | 24 | 800 | 250 |
| 8:1 | 27 | 900 | 27 | 800 | 250 |
| 16:1 | 30 | 900 | 30 | 800 | 250 |

Table VI gives the decoding times of different algorithms on a SUN Sparc-10 workstation on Lena. It can be seen from Table VI that the decoding times of the transform HVQ, plain HVQ, plain VQ and transform VQ are same. It takes 13 ms for decoding a 2:1 compressed image, 16 ms for decoding a 4:1 compressed image and so on. On the other hand JPEG requires 200 ms for decoding at all compression ratios. Thus the HVQ based decoders are 20–40 times faster than a JPEG decoder. The decoding times of transform VQ are same as that of plain VQ as the transforms can be precomputed in the decoder tables. This low computational complexity of HVQ decoding again allows 30 frames per second video decoding in software.

TABLE VI

Decoding times in ms of different algorithms

| Compression Ratio | Transform HVQ | Transform VQ | HVQ | VQ | JPEG |
|---|---|---|---|---|---|
| 2:1 | 13 | 13 | 13 | 13 | 200 |
| 4:1 | 16 | 16 | 16 | 16 | 200 |
| 8:1 | 8.5 | 8.5 | 8.5 | 8.5 | 200 |
| 16:1 | 6.1 | 6.1 | 6.1 | 6.1 | 200 |

The presented techniques for the design of generic block transform based vector quantizer (WTHVQ) encoders implemented by only table lookups reduce the complexity of a full-search VQ encoder. Perceptually significant distortion measures are incorporated into HVQ based on weighting the coefficients of arbitrary transforms. Essentially, the transforms are pre-computed and built into the encoder and decoder lookup tables. The perceptual advantages of transform coding are achieved while maintaining the computational simplicity of table lookup encoding and decoding. These algorithms have applications in multi-rate collaborative video environments. These algorithms (WTHVQ) are also amenable to efficient software and hardware solutions. The low computational complexity of WTHVQ allows 30 frames per second video encoding and decoding in software.

Techniques for the design of generic constrained and recursive vector quantizer encoders implemented by table-lookups include entropy-constrained VQ, tree- structured VQ, classified VQ, product VQ, mean-removed VQ, multi-stage VQ, hierarchical VQ, non-linear interpolative VQ, predictive VQ and weighted universal VQ. These different VQ structures can be combined with hierarchical table-lookup vector quantization using the algorithms presented below.

Specifically considered are: entropy-constrained VQ to get a variable rate code and tree-structured VQ to get an embedded code. In addition, classified VQ, product VQ, mean-removed VQ, multi-stage VQ, hierarchical VQ and non-linear interpolative VQ are considered to overcome the complexity problems of unconstrained VQ and thereby allow the use of higher vector dimensions and larger codebook sizes. Recursive vector quantizers such as predictive VQ achieve the performance of a memory-less VQ with a large codebook while using a much smaller codebook. Weighted universal VQ provide for multi-codebook systems.

Perceptually weighted hierarchical table-lookup VQ can be combined with different con- strained and recursive VQ structures. At the heart of each of these structures, the HVQ encoder still consists of M stages of table lookups. The last stage differs for the different forms of VQ structures.

Entropy-constrained vector quantization (ECVQ), which minimizes the average distortion subject to a constraint on the entropy of the codewords, can be used to obtain a variable-rate system. ECHVQ has the same structure as HVQ, except that the last stage codebook and table are variable-rate. The last stage codebook and table are designed using the ECVQ algorithm, in which an unconstrained minimization problem is solved: $\min(D+\lambda H)$, where D is the average distortion (obtained by taking expected value of d defined above and H is the entropy. Thus this modified distortion measure is used in the design of the last stage codebook and table. The last stage table outputs a variable length index which is sent to the decoder. The decoder has a copy of the last stage codebook and uses the index for the last stage to output the corresponding codeword.

The design of an ECHVQ consists of two major steps. The first step designs VQ codebooks for each stage. Since each VQ stage has a different dimension and rate they are designed separately. As described above, a subjectively meaningful distortion measure is used for designing the codebooks. The codebooks for each stage except the last stage of the ECHVQ are designed independently by the generalized Lloyd algorithm (GLA) run on the appropriate vector size of the training sequence. The last stage codebook is designed using the ECVQ algorithm. The second step in the design of ECHVQ builds lookup tables from the designed codebooks. After having built each codebook the corresponding code tables are built for each stage. All tables except the last stage table are built using the procedure described above. The last stage table is designed using a modified distortion measure. In general the last stage table implements the mapping $$i^M(i_1^{M-1}, i_2^{M-1}) = \arg\min_i d_M((\beta_{M-1}(i_1^{M-1}), \beta_{M-1}(i_2^{M-1})), \beta_M(i)) + \lambda r_M(i)$$

where $r_M(i)$ is the number of bits representing the $i^{th}$ codeword in the last stage codebook. Only the last stage codebook and table need differ for different values of lambda.

A tree-structured VQ at the last stage of HVQ can be used to obtain an embedded code. In ordinary VQ, the codewords lie in an unstructured codebook, and each input vector is mapped to the minimum distortion codeword. This induces a partition of the input space into Voronoi encoding regions. In TSVQ, on the other hand, the codewords are arranged in a tree structure, and each input vector is successively mapped (from the root node) to the minimum distortion child node. This induces a hierarchical partition, or refinement of the input space as the depth of the tree increases. Because of this successive refinement, an input vector mapping to a leaf node can be represented with high precision by the path map from the root to the leaf, or with lower precision by any prefix of the path. Thus TSVQ produces an embedded encoding of the data. If the depth of the tree is R and the vector dimension is k, then bit rates 0/k, 1/k . . . , R/k, can all be achieved.

Variable-rate TSVQs can be constructed by varying the depth of the tree. This can be done by "greedily growing" the tree one node at a time (GGTSVQ), or by growing a large tree and pruning back to minimize its average distortion subject to a constraint on its average length (PTSVQ) or entropy (EPTSVQ). The last stage table outputs a fixed or variable length embedded index which is sent to the decoder. The decoder has a copy of the last stage tree-structured codebook and uses the index for the last stage to output the corresponding codeword.

Thus TSHVQ has the same structure as HVQ except that the last stage codebook and table are tree-structured. Thus in TSHVQ the last stage table outputs a fixed or variable length embedded index which is transmitted on the channel. The design of a TSHVQ again consists of two major steps. The first step designs VQ codebooks for each stage. The codebooks for each stage except the last stage of the TSHVQ are designed independently by the generalized Lloyd algorithm (GIA) run on the appropriate vector size of the training sequence. The second step in the design of TSHVQ builds lookup tables from the designed codebooks. After having built each codebook, the corresponding code tables are built for each stage. All tables except the last stage table are built using the procedure described above. The last stage table is designed by setting $i^M(i_1^{M-1}, i_2^{M-1})$ to the variable length index i to which the concatenated vector $\beta_{M-1}(i_1^{M-1}), \beta_{M-1}(i_2^{M-1})$ is encoded by the tree structured codebook.

In Classified Hierarchical Table-Lookup VQ (CHVQ), a classifier is used to decide the class to which each input vector belongs. Each class has a set of HVQ tables designed based on codebooks for that class. The classifier can be a nearest neighbor classifier designed by GLA or an ad hoc edge classifier or any other type of classifier based on features of the vector, e.g., mean and variance. The CHVQ encoder decides which class to use and sends the index for the class as side information.

Traditionally, the advantage of classified VQ has been in reducing the encoding complexity of full-search VQ by using a smaller codebook for each class. Here the advantage with CHVQ is that bit allocation can be done to decide the rate for a class based on the semantic significance of that class. The encoder sends side-information to the decoder about the class for the input vector. The class determines which hierarchy of tables to use. The last stage table outputs a fixed or variable length index which is sent to the decoder. The decoder has a copy of the last stage codebook for the different classes and uses the index for the last stage to output the corresponding codeword from the class codebook based on the received classification information.

Thus CHVQ has the same structure as HVQ except that each class has a separate set of HVQ tables. In CHVQ the last stage table outputs a fixed or variable (entropy-constrained CHVQ) length index which is sent to the decoder. The design of a CHVQ again consists of two major steps. The first step designs VQ codebooks for each stage for each class as for HVQ or ECHVQ. After having built each codebook the corresponding code tables are built for each stage for each class as in HVQ or ECHVQ.

Product Hierarchical Table Lookup VQ reduces the storage complexity in coding a high dimensional vector by splitting the vector into two or more components and encode each split vector independently. For example, an 8×8 block can be encoded as four 4×4 blocks, each encoded using the same set of HVQ tables for a 4×4 block. In general, the input vector can be split into sub-vectors of varying dimension where each sub-vector will be encoded using the HVQ tables to the appropriate stage. The table and codebook design in this case is exactly the same as for HVQ.

Mean-Removed Hierarchical Table-Lookup VQ (MRHVQ) is a form of product code to reduce the encoding and decoding complexity. It allows coding higher dimensional vectors at higher rates. In MRHVQ, the input vector is split into two component features: a mean (scalar) and a residual (vector). MRHVQ is a mean-removed VQ in which the full search encoder is replaced by table-lookups. In the MRHVQ encoder, the first stage table outputs an 8-bit index for a residual and an 8-bit mean for a 2×1 block. The 8-bit index for the residual is used to index the second stage table. The output of the second stage table is used as input to the third stage. The 8-bit means for several 2×1 blocks after the first stage are further averaged and quantized for the input block and transmitted to the decoder independently of the residual index. The last stage table outputs a fixed or variable length (entropy-constrained MRHVQ) residual index which is sent to the decoder. The decoder has a copy of the last stage codebook and uses the index for the last stage to output the corresponding codeword from the codebook and adds the received mean of the block.

MRHVQ has the same structure as the HVQ except that all codebooks and tables are designed for mean-removed vectors. The design of a MRHVQ again consists of two major steps. The first step designs VQ codebooks for each stage as for HVQ or ECHVQ on the mean-removed training set of the appropriate dimension. After having built each codebook the corresponding code tables are built for each stage as in HVQ or ECHVQ.

Multi-Stage Hierarchical Table-Lookup VQ (MSHVQ) is a form of product code which allows coding higher dimensional vectors at higher rates. MSHVQ is a multi-stage VQ in which the full search encoder is replaced by a table-lookup encoder. In MSHVQ, the encoding is performed in several stages. In the first stage the input vector is coarsely quantized using a set of HVQ tables. The first stage index is transmitted as coarse-level information. In the second stage the residual between the input and the first stage quantized vector is again quantized using another set of HVQ tables. Note that the residual can be obtained through table-lookups at the second stage.). The second stage index is sent as refinement information to the decoder. This procedure continues in which the residual between successive stages is encoded using a new set of HVQ tables. There is a need for bit-allocation between the different stages of MSHVQ. The decoder uses the transmitted indices to look up the corresponding codebooks and adds the reconstructed vectors.

MSHVQ has the same structure as the HVQ except that it has several stages of HVQ. In MSHVQ each stage outputs a fixed or variable (entropy-constrained MSHQ) length index which is sent to the decoder. The design of a MSHVQ consists of two major steps. The first stage encoder codebooks are designed as in HVQ. The second stage codebooks are designed closed loop by using the residual between the training set and the quantized training set after the first stage. After having built each codebook the corresponding code tables are built for each stage essentially as in HVQ or ECHVQ. The only difference is that the tables for the second and subsequent stages are designed for residual vectors.

Hierarchical-Hierarchical Table-Lookup VQ (H-HVQ) again allows coding higher dimensional vectors at higher rates. H-HVQ is a hierarchical VQ in which the fill search encoder is replaced by a table-lookup encoder. As in MSHVQ, the H-HVQ encoding is performed in several stages. In the first stage a large input vector (super-vector) is coarsely quantized using a set of HVQ tables to give a quantized feature vector. The first stage index is transmitted to the decoder. In the second stage the residual between the input and the first stage quantized vector is again quantized using another set of HVQ tables but the super-vector is split into smaller sub-vectors. Note that the residual can be obtained through table-lookups at the second stage. The second stage index is also sent to the decoder. This procedure of partitioning and quantizing the super-vector by encoding the successive residuals is repeated for each stage. There is a need for bit-allocation between the different stages of H-HVQ. The decoder uses the transmitted indices to look up the corresponding codebooks and adds the reconstructed vectors. The structure of H-HVQ encoder is similar to that of MSHVQ except that in this case the vector dimensions at the first stage and subsequent stages of encoding differ. The design of a H-HVQ is same as that of MSHVQ with the only difference is that the vector dimension reduces in subsequent stages.

Non-linear Interpolative Table-Lookup VQ (NIHVQ) allows a reduction in encoding and storage complexity compared to HVQ. NIHVQ is a non-linear interpolative VQ in which the full-search encoder is replaced by a table-lookup encoder. In NIHVQ, the encoding is performed as in HVQ, except that a feature vector is extracted from the original input vector and the encoding is performed on the reduced dimension feature vector. The last stage table outputs a fixed or variable length (entropy-constrained NIHVQ) index which is sent to the decoder. The decoder has a copy of the last stage codebook and uses the index for the last stage to output the corresponding codeword. The decoder codebook has the optimal non-linear interpolated codewords of the dimension of the input vector.

The design of a NIHVQ consists of two major steps. The first step designs encoder VQ codebooks from the feature vector for each stage as for HVQ or ECHVQ. The last stage codebook is designed using nonlinear interpolative VQ. After having built each codebook the corresponding code tables are built for each stage for each class as in HVQ or ECHVQ.

Predictive Hierarchical Table-Lookup VQ (PHVQ) is a VQ with memory. The only difference between PHVQ and predictive VQ (PVQ) is that the full search encoder is replaced by a hierarchical arrangement of table-lookups. PHVQ takes advantage of the inter-block correlation in images. PHVQ achieves the performance of a memory-less VQ with a large codebook while using a much smaller codebook. In PHVQ, the current block is predicted based on the previously quantized neighboring blocks using linear prediction and the residual between the current block and its prediction is coded using HVQ. The prediction can also be performed using table-lookups and the quantized predicted block is used for calculating the residual again through table-lookups. The last stage table outputs a fixed or variable length index for the residual which is sent to the decoder. The decoder has a copy of the last stage codebook and uses the index for the last stage to output the corresponding codeword from the codebook. The decoder also predicts the current block from the neighboring blocks using table-lookups and adds the received residual to the predicted block.

In PHVQ, all codebooks and tables are designed for the residual vectors. In PHVQ, the last stage table outputs a fixed or variable (entropy-constrained PHVQ) length index which is sent to the decoder. The design of a PHVQ consists of two major steps. The first step designs VQ codebooks for each stage as for HVQ or ECHVQ on the residual training set of the appropriate dimension (closed-loop codebook design). After having built each codebook the corresponding code tables are built for each stage as in HVQ or ECHVQ, the only difference is that the residual can be calculated in the first stage table Weighted Universal Hierarchical Table-Lookup VQ (WUHVQ) is a multiple-codebook VQ system in which a super-vector is encoded using a set of HVQ tables and the one which minimize the distortion is chosen to encode all vectors within the super-vector. Side-information is sent to inform the decoder about which codebook to use. WUTHVQ is a weighted universal VQ (WUVQ) in which the selection of codebook for each super-vector and the encoding of each vector within the super-vector is done through table-lookups. The last stage table outputs a fixed or variable length (entropy-constrained WUHVQ) index which is sent to the decoder. The decoder has a copy of the last stage codebook for the different tables and uses the index for the last stage to output the corresponding codeword from the selected codebook based on the received side-information.

WUHVQ has multiple sets of HVQ tables. The design of a WUHVQ again consists of two major steps. The first step designs WUHVQ codebooks for each stage as for HVQ or ECHVQ. After having built each codebook the corresponding HVQ tables are built for each stage for each set of HVQ tables as in HVQ or ECHVQ.

Simulation results have been obtained for the different HVQ algorithms. FIGS. 4–8 show the PSNR (peak signal-noise-ratio) results on the 8-bit monochrome image Lena (512×512) as a function of bit-rate for the different algorithms. The codebooks for the VQs have been generated by training on 10 different images. PSNR results are given for unweighted VQs; weighting reduces the PSNR though the subjective quality of compressed images improves significantly. One should however note that there is about 2 dB equivalent gain in PSNR by using a subjective distortion measure.

FIG. 4 gives the PSNR results on Lena for greedily-grown-then pruned, variable-rate, tree-structured hierarchical vector quantization (VRTSHVQ). The results are for 4×4 blocks where the last stage is tree-structured. VRTSHVQ gives an embedded code at the last stage. VRTSHVQ again gains over HVQ. There is again about 0.5–0.7 dB loss compared to non-hierarchical variable-rate tree-structured table-based vector quantization (VRTSVQ).

Figure 5:
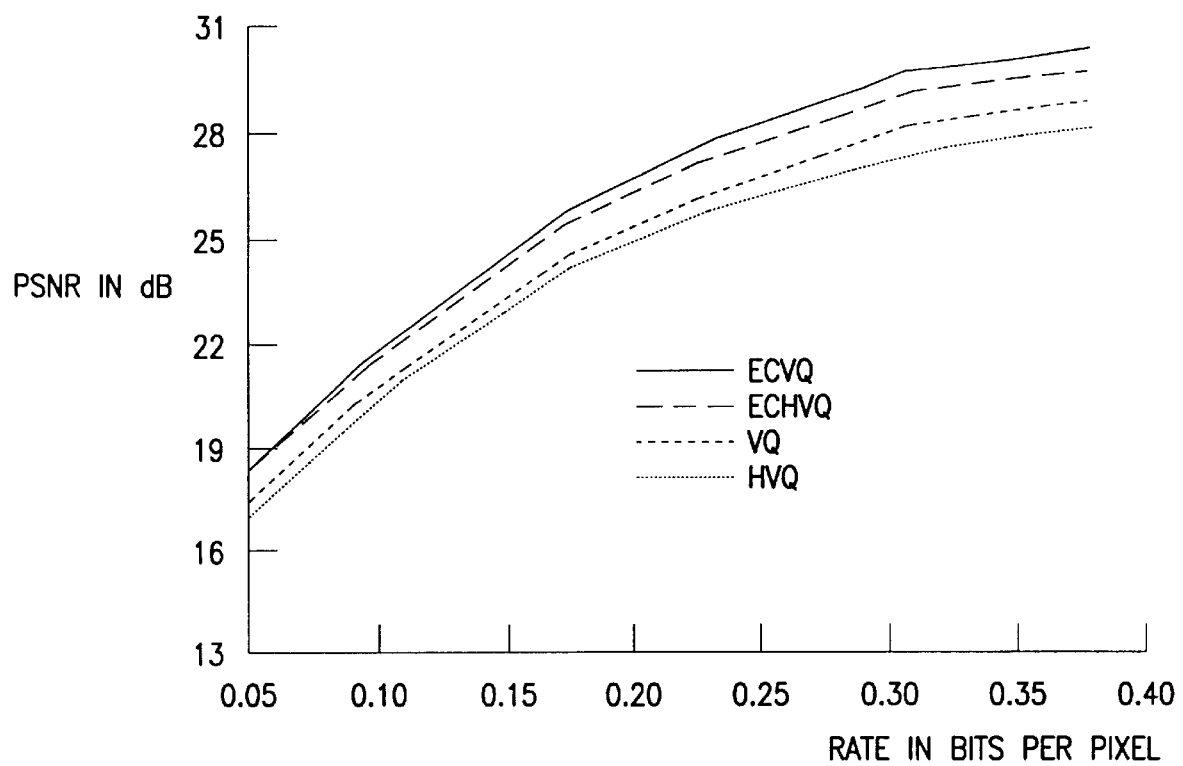
FIGS. 5–8 are graphs indicating the performance of other embodiments of the present invention.

FIG. 5 gives the PSNR results on Lena for different bit-rates for plain VQ and plain HVQ. The results are on 4×4 blocks. We find that the HVQ performs around 0.5–0.7 dB worse than the full search VQ. FIG. 4 also gives the PSNR results on Lena for entropy-constrained HVQ (ECHVQ) with 256 codewords at the last stage. The results are on 4×4 blocks where the first three stages of ECHVQ are fixed-rate and the last stage is variable rate. It can be seen that ECHVQ gains around 1.5 d over HVQ. There is however again a 0.5–0.7 dB loss compared to ECVQ.

Classified HVQ performs slightly worse than HVQ in rate-distortion but has the advantage of lower complexity (encoding and storage) by using smaller codebooks for each class. Product HVQ again performs worse in rate-distortion complexity compared to HVQ but has much lower encoding and storage complexity compared to HVQ as it partitions the input vector into smaller sub-vectors and encodes each one of them using a smaller set of HVQ tables. Mean-removed HVQ (MRHVQ) again performs worse in rate-distortion compared to HVQ but allows coding higher dimensional vectors at higher rates using the HVQ structure.

Figure 6:
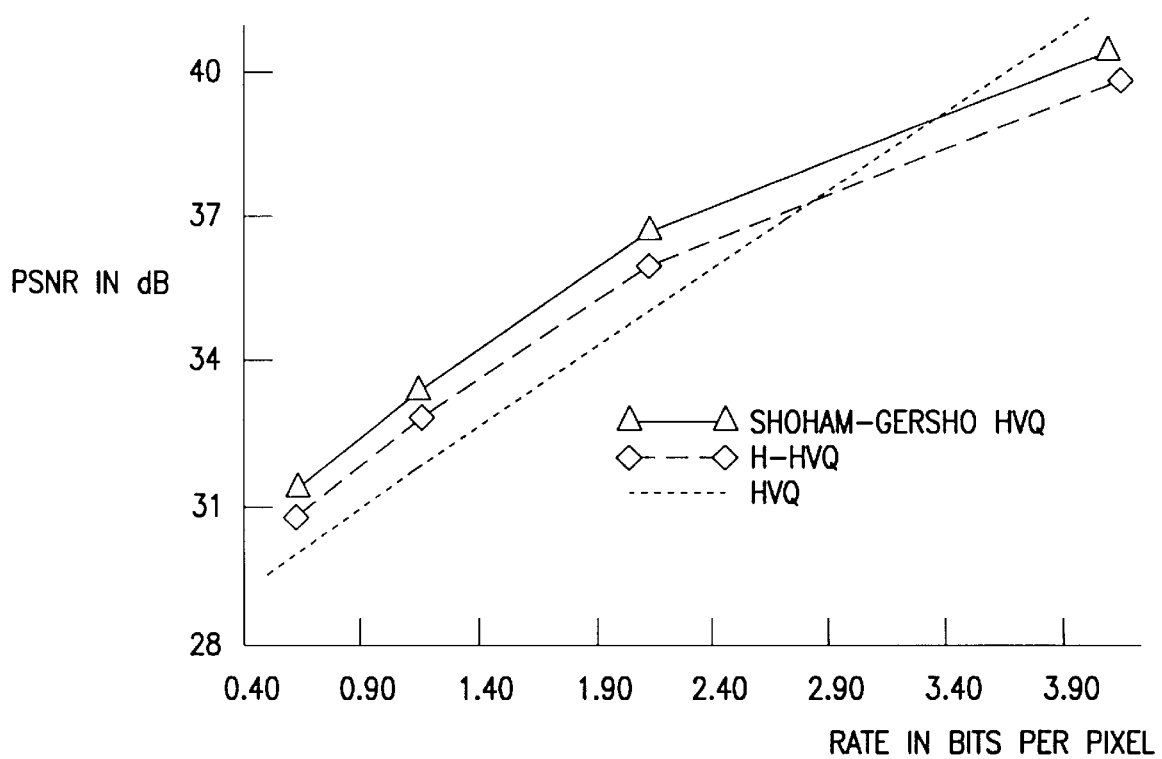

FIG. 6 gives the PSNR results on Lena for hierarchical-HVQ (H-HVQ). The results are for 2-stage H-HVQ. The first stage operates on 8×8 blocks and is coded using HVQ to 8 bits. In the second stage the a residual is coded again using another set of HVQ tables. FIG. 11 shows the results at different stages of the second-stage H-HVQ (each stage is coded to 8 bits). Fixed-rate H-HVQ gains around 0.5–1 dB over fixed- rate HVQ at most rates. Multi-stage HVQ (MSHVQ) is identical to H-HVQ where the second stage is coded to the original block size. Thus the performance of MSHVQ can also be seen from FIG. 11. There is again about 0.5–0.7 dB loss compared to full search Shoham-Gersho HVQ results.

Figure 7:
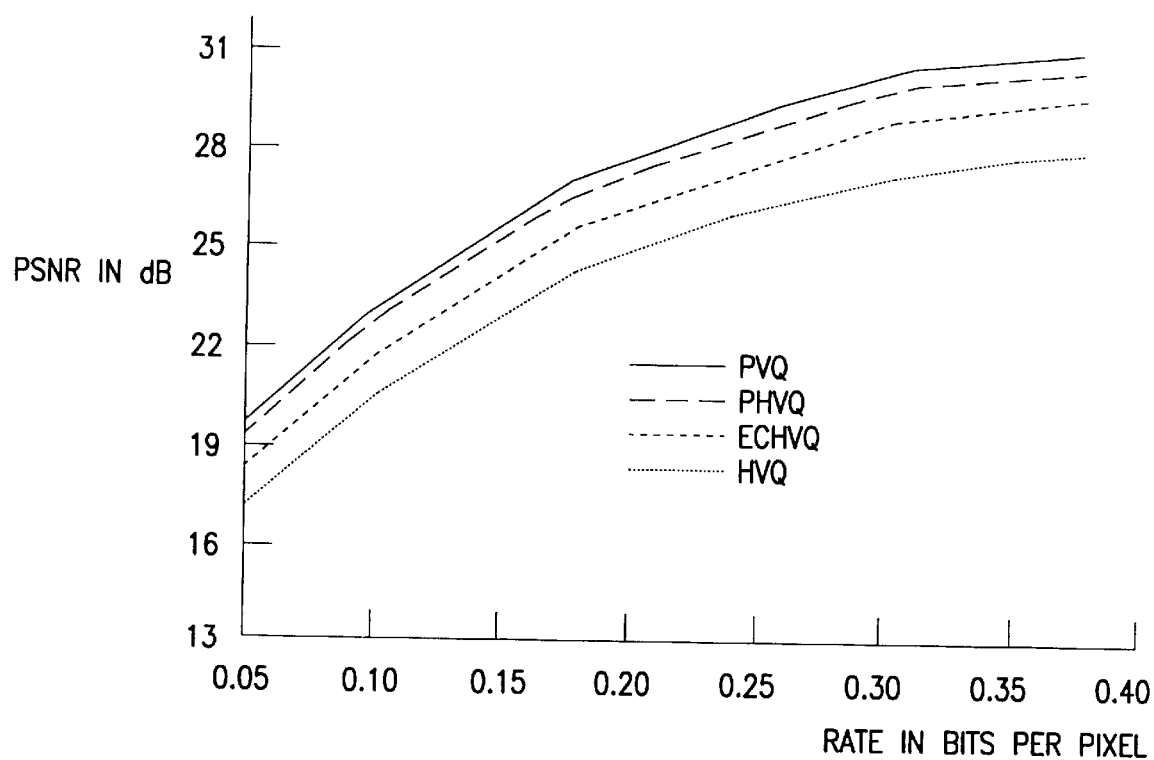

FIG. 7 gives the PSNR results on Lena for entropy-constrained predictive HVQ (ECPHVQ) with 256 codewords at the last stage. The results are on 4×4 blocks where the first three stages of ECPHVQ are fixed-rate and the last stage is variable rate. It can be seen that ECPHVQ gains around 2.5 dB over fixed-rate HVQ and 1 dB over ECHVQ. There is however again a 0.5–0.7 dB loss compared to ECPVQ.

Figure 8:
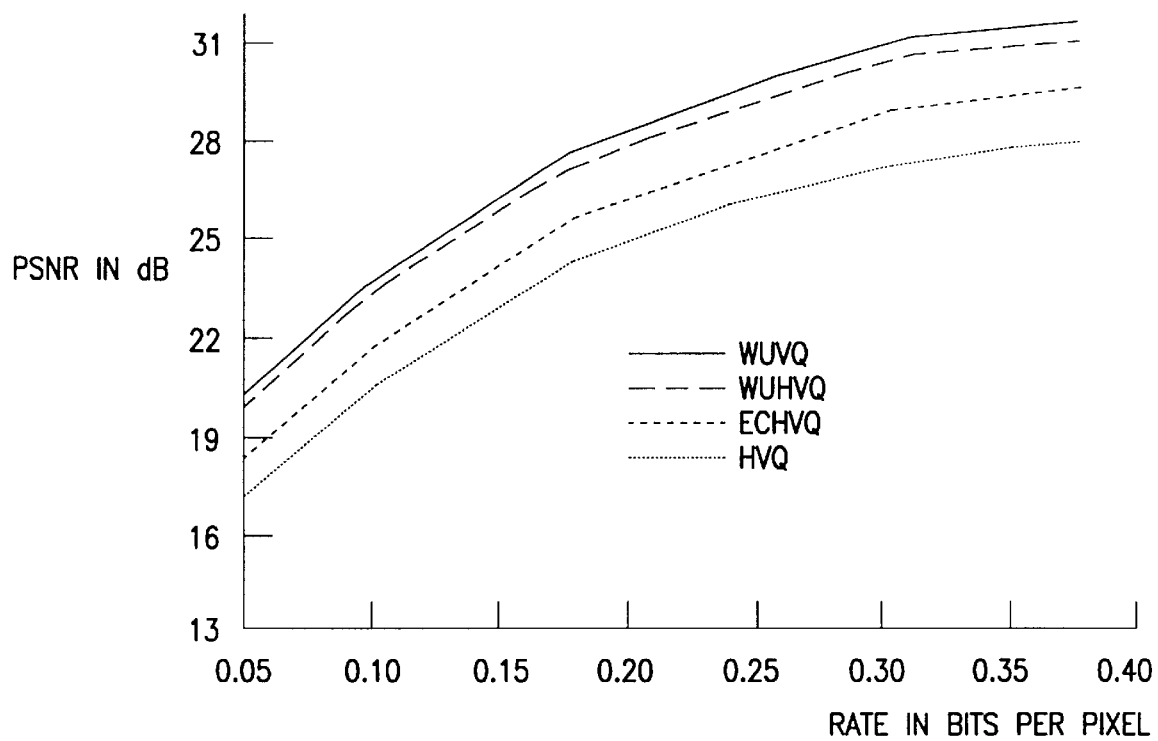
Figure 9:
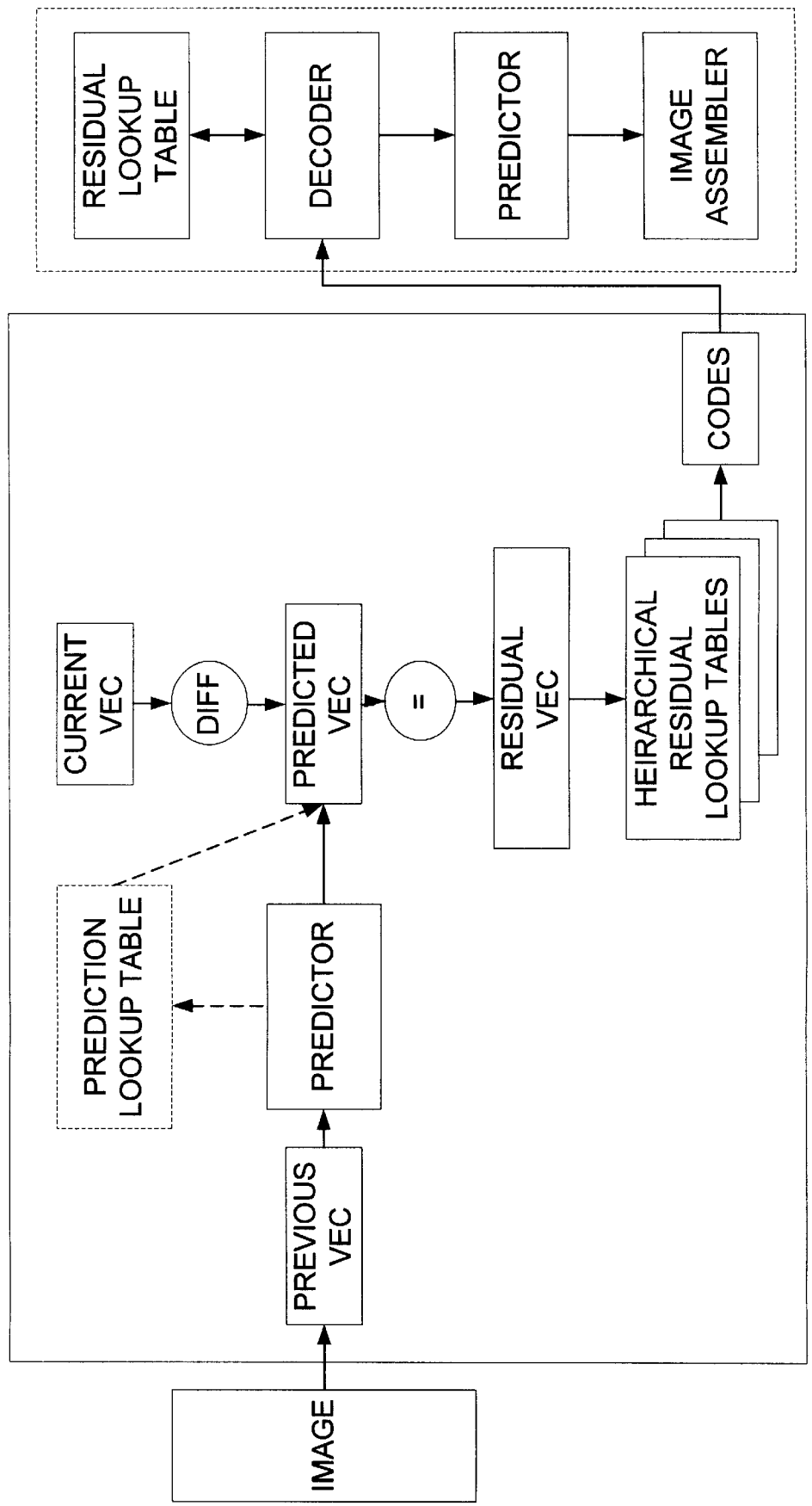
FIG. 9 is a schematic illustration of an image compression and decompression system in accordance with the invention.

FIG. 8 gives the PSNR results for entropy-constrained weighted-universal HVQ (ECWUHVQ). The super-vector is 16×16 blocks for these simulations and the smaller blocks are 4×4. There are 64 codebooks each with 256 4×4 codewords. It can be seen that ECWUHVQ gains around 3 dB over fixed-rate HVQ and 1.5 dB over ECHVQ. There is however again a 0.5–0.7 dB loss compared to WUVQ.

The encoding times of the transform HVQ and plain HVQ are same. It takes 12 ms for the first stage encoding, 24 ms for the first two stages and 30 ms for the first four stages of encoding a 512×512 image on a Sparc-10 Workstation. On the other hand JPEG requires 250 ms for encoding at similar compression ratios. The encoding complexity of constrained and recursive HVQs increases by a factor of 2–8 compared to plain HVQ. The HVQ based encoders are around 50–100 times faster than their corresponding full search VQ encoders.

Similarly the decoding times of the transform HVQ, plain HVQ, plain VQ and transform VQ are same. It takes 13 ms for decoding a 2:1 compressed image, 16 ms for decoding a 4:1 compressed image and 6 ms for decoding a 16:1 compressed 512×512 image on a Sparc-10 Workstation. On the other hand JPEG requires 200 ms for decoding at similar compression ratios. The decoding complexity of constrained and recursive HVQs does not increase much compared to that of HVQ. Thus the HVQ based decoders are around 20–30 times faster than a JPEG decoder. The decoding times of transform VQs are same as that of plain VQs as the transforms can be precomputed in the decoder tables.

Thus to summarize, constrained and recursive HVQ structures overcome the problems of fixed-rate memory-less VQ. The main advantage of these algorithms is very low computational complexity compared to the corresponding VQ structures. Entropy-constrained HVQ gives a variable rate code and performs better than HVQ. Tree-structured HVQ gives an embedded code and performs better than HVQ. Classified HVQ, product HVQ, mean-removed HVQ, multi-stage HVQ, hierarchical HVQ and non-linear interpolative HVQ overcome the complexity problems of unconstrained VQ and allow the use of higher vector dimensions and achieve higher rates. Predictive HVQ achieves the performance of a memory-less VQ with a large codebook while using a much smaller codebook. It provides better rate-distortion performance by taking advantage of inter-vector correlation. Weighted universal HVQ again gains significantly over HVQ in rate-distortion. Further some of these algorithms (e.g. PHVQ, WUHVQ) with subjective distortion measures perform better or comparable to JPEG in rate-distortion at a lower decoding complexity.

As indicated above, constrained and recursive vector quantizer encoders implemented by table-lookups. These vector quantizers include entropy constrained VQ, tree-structured VQ, classified VQ, product VQ, mean-removed VQ, multi-stage VQ, hierarchical VQ, non-linear interpolative VQ, predictive VQ and weighted-universal VQ. Our algorithms combine these different VQ structures with hierarchical table-lookup vector quantization. This combination significantly reduces the complexity of the original VQ structures. We have also incorporated perceptually significant distortion measures into HVQ based on weighting the coefficients of arbitrary transforms. Essentially, the transforms are pre-computed and built into the encoder and decoder lookup tables. Thus we gain the perceptual advantages of transform coding while maintaining the computational simplicity of table-lookup encoding and decoding. These and other modifications to and variations upon the preferred embodiments are provided for by the present invention, the scope of which is defined by the following claims.

What is claimed is:

1. A data compression system, comprising:

a vectorizer configured to convert data into a series of data vectors;

a predictor configured to make a prediction of a current data vector based on at least one previous data vector, the predictor being coupled to the vectorizer for receiving the data vectors;

a hierarchical lookup table configured to map residuals to a set of codes so that one of the codes is generated in response to each of the data vectors, each of the residuals representing a difference between the current data vector and the prediction, the lookup table being coupled to the predictor for receiving the data vectors; and wherein the hierarchical lookup table comprises at least a first stage lookup table designed using a codebook design procedure incorporating block transforms and a final stage lookup table designed using a tree structured codebook design procedure such that the residuals are mapped to the set of codes by successive utilization of the first stage and final stage lookup tables.

2. The system of claim 1, wherein the at least one previous data vector is a neighboring data vector to the current data vector.

3. The system of claim 1, wherein the prediction is obtained through a prediction lookup table configured to map the at least one previous data vector to the prediction.

4. The system of claim 1, wherein the residuals are obtained through a residual lookup table configured to map predictions to residuals.

5. The system of claim 1, wherein the set of codes comprise codes of different lengths.

6. The system of claim 1, wherein the set of codes comprise non-embedded codes.

7. The system of claim 1, wherein the data vectors are blocks of pixels of an image represented by the data.

8. In a computer system, a method of compressing data, comprising:

receiving data as input;

converting the data into a series of data vectors;

making a prediction of a current data vector based on at least one previous data vector;

utilizing a hierarchical lookup table, mapping residuals to a set of codes so that one of the codes is generated in response to each of the data vectors, each of the residuals representing a difference between the current data vector and the prediction; and wherein the hierarchical lookup table comprises at least a first stage lookup table designed using a codebook design procedure incorporating block transforms and a final stage lookup table designed using a tree structured codebook design procedure such that residuals are mapped to the set of codes by successive utilization of the first stage and final stage lookup tables.

9. The method of claim 8, wherein the at least one previous data vector is a neighboring data vector to the current data vector.

10. The method of claim 8, further comprising obtaining the prediction is obtained through a prediction lookup table configured to map the at least one previous data vector to the prediction.

11. The method of claim 8, further comprising obtaining the residuals through a residual lookup table configured to map predictions to residuals.

12. The method of claim 8, wherein the set of codes comprise codes of different lengths.

13. The method of claim 8, wherein the set of codes comprise non-embedded codes.

14. The method of claim 8, wherein the data vectors are blocks of pixels of an image represented by the data.

* * * * *